United States Patent
Liu et al.

(10) Patent No.: US 11,281,342 B2
(45) Date of Patent: Mar. 22, 2022

(54) TOUCH CONTROL STRUCTURE, METHOD OF DETECTING TOUCH USING TOUCH CONTROL STRUCTURE, TOUCH CONTROL APPARATUS, AND TOUCH CONTROL DISPLAY APPARATUS

(71) Applicant: BOE Technology Group Co., Ltd., Beijing (CN)

(72) Inventors: Ming Liu, Beijing (CN); Yueping Zuo, Beijing (CN); Qiuhua Meng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 136 days.

(21) Appl. No.: 16/761,861

(22) PCT Filed: Dec. 16, 2019

(86) PCT No.: PCT/CN2019/125550
§ 371 (c)(1),
(2) Date: May 6, 2020

(87) PCT Pub. No.: WO2020/253168
PCT Pub. Date: Dec. 24, 2020

(65) Prior Publication Data
US 2021/0405811 A1    Dec. 30, 2021

(30) Foreign Application Priority Data
Jun. 19, 2019    (CN) .......................... 201910531025.7

(51) Int. Cl.
*G06F 3/044*        (2006.01)
*G06F 3/041*        (2006.01)
(Continued)

(52) U.S. Cl.
CPC .......... *G06F 3/0445* (2019.05); *G06F 3/0416* (2013.01); *G06F 3/0446* (2019.05);
(Continued)

(58) Field of Classification Search
None
See application file for complete search history.

(56) References Cited

U.S. PATENT DOCUMENTS

2011/0285641 A1    11/2011    Huang et al.
2016/0103536 A1    4/2016    Xiong et al.
(Continued)

FOREIGN PATENT DOCUMENTS

CN    205068344 U    3/2016
CN    107305451 A    10/2017
(Continued)

OTHER PUBLICATIONS

International Search Report & Written Opinion dated Mar. 19, 2020, regarding PCT/CN2019/125550.
(Continued)

*Primary Examiner* — Stephen T. Reed
(74) *Attorney, Agent, or Firm* — Intellectual Valley Law, P.C.

(57) ABSTRACT

A touch control structure is provided. The touch control structure includes a first touch electrode including a plurality of first touch control blocks; a second touch electrode including a plurality of second touch control blocks; and one or more reversibly deformable elastic supports between and in direct contact with a respective one of the plurality of first touch control blocks and a respective one of the plurality of second touch control blocks. When the touch control structure is in a first state without a touch, the respective one of the plurality of first touch control blocks includes a first overlapping portion and a first margin portion abutting the
(Continued)

first overlapping portion, and the respective one of the plurality of second touch control blocks includes a second overlapping portion and a second margin portion abutting the second overlapping portion.

20 Claims, 15 Drawing Sheets

(51) Int. Cl.
    *H01L 27/32*     (2006.01)
    *G02F 1/1333*     (2006.01)

(52) U.S. Cl.
    CPC ........ *G02F 1/13338* (2013.01); *G06F 3/0412* (2013.01); *G06F 2203/04105* (2013.01); *H01L 27/323* (2013.01)

(56) References Cited

U.S. PATENT DOCUMENTS

| | | |
|---|---|---|
| 2016/0342259 A1 | 11/2016 | Xiong et al. |
| 2017/0045969 A1 | 2/2017 | Liao et al. |
| 2017/0308240 A1 | 10/2017 | Yeh et al. |
| 2018/0107325 A1 | 4/2018 | Hong et al. |

FOREIGN PATENT DOCUMENTS

| | | |
|---|---|---|
| CN | 107957806 A | 4/2018 |
| CN | 108534921 A | 9/2018 |

OTHER PUBLICATIONS

First Office Action in the Chinese Patent Application No. 201910531025.7, dated Mar. 17, 2020; English translation attached.

TOUCH CONTROL STRUCTURE, METHOD OF DETECTING TOUCH USING TOUCH CONTROL STRUCTURE, TOUCH CONTROL APPARATUS, AND TOUCH CONTROL DISPLAY APPARATUS

CROSS-REFERENCE TO RELATED APPLICATION

This application is a national stage application under 35 U.S.C. § 371 of International Application No. PCT/CN2019/125550, filed Dec. 16, 2019, which claims priority to Chinese Patent Application No. 201910531025.7, filed Jun. 19, 2019. Each of the forgoing applications is herein incorporated by reference in its entirety for all purposes.

TECHNICAL FIELD

The present invention relates to display technology, more particularly, to a touch control structure, a method of detecting a touch using a touch control structure, a touch control apparatus, and a touch control display apparatus.

BACKGROUND

Touch control display panels have found a wide range of applications in the display field such as mobile phones, computer display panels, touch screens, satellite navigation devices, and digital cameras. Touch control display panels can be categorized into three classes: add-on type touch panels, on-cell type touch panels, and in-cell type touch panels. Touch control display panels may be a self-capacitive type or a mutual capacitive type touch display panel. Touch control display panels may use mesh electrodes as the touch electrodes or use metal oxide materials (e.g., indium tin oxide) as the touch electrode material.

SUMMARY

In one aspect, the present invention provides a touch control structure, comprising a first touch electrode comprising a plurality of first touch control blocks; a second touch electrode comprising a plurality of second touch control blocks; and one or more reversibly deformable elastic supports between and in direct contact with a respective one of the plurality of first touch control blocks and a respective one of the plurality of second touch control blocks; wherein, when the touch control structure is in a first state without a touch, the respective one of the plurality of first touch control blocks comprises a first overlapping portion and a first margin portion abutting the first overlapping portion, and the respective one of the plurality of second touch control blocks comprises a second overlapping portion and a second margin portion abutting the second overlapping portion; wherein an orthographic projection of the first overlapping portion on a base substrate completely overlaps with an orthographic projection of the second overlapping portion on the base substrate, resulting in a first overlapping area; and the first overlapping portion and the first margin portion are arranged along a direction the same as a direction along which the second margin portion and the second overlapping portion are arranged.

Optionally, when the touch control structure is in a second state upon a touch, the respective one of the plurality of first touch control blocks comprises a third overlapping portion, and the respective one of the plurality of second touch control blocks comprises a fourth overlapping portion; wherein an orthographic projection of the third overlapping portion on the base substrate completely overlaps with an orthographic projection of the fourth overlapping portion on the base substrate, resulting in a second overlapping area; and the first overlapping area is smaller than the second overlapping area.

Optionally, the respective one of the plurality of first touch control blocks comprises a first side, and a second side opposite to the first side; the respective one of the plurality of second touch control blocks comprises a third side, and a fourth side opposite to the third side; wherein in the first state, an orthographic projection of at least a portion of the first side on the respective one of the plurality of second touch control blocks is between the third side and the fourth side; and an orthographic projection of at least a portion of the fourth side on the respective one of the plurality of first touch control blocks is between the first side and the second side.

Optionally, a first distance between the orthographic projection of the first side on the respective one of the plurality of second touch control blocks and the third side decreases from the first state to the second state; and a second distance between the second side and the orthographic projection of the fourth side on the respective one of the plurality of first touch control blocks decreases from the first state to the second state.

Optionally, the touch control structure further comprises a first movement guiding protrusion protruding from a surface of the respective one of the plurality of first touch control blocks toward the respective one of the plurality of second touch control blocks; and a second movement guiding protrusion protruding from a surface of the respective one of the plurality of second touch control blocks toward the respective one of the plurality of first touch control blocks.

Optionally, during at least a sub-period of a period during which the touch control structure transition from the first state to the second state; the first movement guiding protrusion is configured to guide the respective one of the plurality of first touch control blocks to move relative to the respective one of the plurality of second touch control blocks along a first relative moving direction opposite to a second relative moving direction along which the second movement guiding protrusion is configured to guide the respective one of the plurality of second touch control blocks to move relative to the respective one of the plurality of first touch control blocks.

Optionally, the respective one of the plurality of first touch control blocks and the respective one of the plurality of second touch control blocks are spaced apart by a spacing distance; wherein, during the at least the sub-period, the spacing distance is positively correlated to the first distance, and positively correlated to the second distance.

Optionally, the first movement guiding protrusion comprises a first guiding surface in direct contact with the second movement guiding protrusion in at least one of the first state or the second state; wherein, during the at least the sub-period, the second movement guiding protrusion undergoes a relative movement, along the first guiding surface, with respect to the first movement guiding protrusion.

Optionally, the second movement guiding protrusion has a second guiding surface in direct contact with the first movement guiding protrusion in at least one of the first state or the second state; wherein, during the at least the sub-period, the first movement guiding protrusion undergoes a relative movement, along the second guiding surface, with respect to the second movement guiding protrusion.

Optionally, planes respectively containing the first guiding surface and the second guiding surface are substantially parallel to each other; a first included angle between the first guiding surface and a first contacting interface between the first movement guiding protrusion and the respective one of the plurality of first touch control blocks is an acute angle; and a second included angle between the second guiding surface and a second contacting interface between the second movement guiding protrusion and the respective one of the plurality of second touch control blocks is an acute angle.

Optionally, the first movement guiding protrusion and the second movement guiding protrusion have shapes selected from a group consisting of a triangular prism, and a parallel hexahedron.

Optionally, the first movement guiding protrusion has a first guiding surface in direct contact with the second movement guiding protrusion in at least one of the first state or the second state; the second movement guiding protrusion has a second guiding surface in direct contact with the first movement guiding protrusion in at least one of the first state or the second state; and the first guiding surface and the second guiding surface are convex surfaces.

Optionally, the first movement guiding protrusion and the second movement guiding protrusion have partial spherical shapes; and along a plane perpendicular to the respective one of the plurality of first touch control blocks and perpendicular to the respective one of the plurality of second touch control blocks, a cross section of the first movement guiding protrusion and a cross section of the second movement guiding protrusion are partial circular shapes.

In another aspect, the present invention provides a method of detecting a touch using a touch control structure, wherein the touch control structure comprises a first touch electrode comprising a plurality of first touch control blocks; a second touch electrode comprising a plurality of second touch control blocks; and one or more elastic supports between and in direct contact with a respective one of the plurality of first touch control blocks and a respective one of the plurality of second touch control blocks; wherein, when the touch control structure is in a first state without a touch, the respective one of the plurality of first touch control blocks comprises a first overlapping portion and a first margin portion abutting the first overlapping portion, and the respective one of the plurality of second touch control blocks comprises a second overlapping portion and a second margin portion abutting the second overlapping portion; wherein an orthographic projection of the first overlapping portion on a base substrate completely overlaps with an orthographic projection of the second overlapping portion on the base substrate, resulting in a first overlapping area and the first overlapping portion and the first margin portion are arranged along a direction the same as a direction along which the second margin portion and the second overlapping portion are arranged; the method comprises detecting a change of capacitance between the respective one of the plurality of first touch control blocks and the respective one of the plurality of second touch control blocks upon a touch; and determining a touch position and a touch pressure based on a change of capacitance.

Optionally, orthographic projections of respective portions of the respective one of the plurality of first touch control blocks and the respective one of the plurality of second touch control blocks on a base substrate completely overlap with each other, resulting in an overlapping area; and the respective one of the plurality of first touch control blocks and the respective one of the plurality of second touch control blocks are spaced apart by a spacing distance; the method comprises increasing the overlapping area and decreasing the spacing distance when the touch structure transitions from a first state absent of a touch to a second state in which a touch occurs.

In another aspect, the present invention provides a touch control apparatus, comprising a touch control structure described herein or fabricated by a method described herein; and one or more integrated circuits connected to the touch control structure.

In another aspect, the present invention provides a touch control display apparatus, comprising a touch control structure described herein or fabricated by a method described herein; and one or more integrated circuits connected to the touch control structure.

Optionally, the touch control display apparatus further comprises a display area comprising a plurality of subpixel regions and an inter-subpixel region; wherein the touch control structure is limited in the inter-subpixel region.

Optionally, the touch control display apparatus further comprises a liquid crystal display substrate.

Optionally, the touch control display apparatus further comprises an organic light emitting diode (OLED) display substrate; and an encapsulating layer encapsulating the OLED display substrate; wherein the touch control structure is on a side of the encapsulating layer away from the OLED display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The capacitive type touch control display panels have a low touch detect precision and accuracy, which may have an adverse effect on the user experience and limited the scope of application of the capacitive type touch control structures used in the touch control display panels.

Accordingly, the present disclosure provides, inter alia, a touch control structure, a method of detecting a touch using a touch control structure, a touch control apparatus, and a touch control display apparatus that substantially obviate one or more of the problems due to limitations and disadvantages of the related art. In one aspect, the present disclosure provides a touch control structure. In some embodiments, the touch control structure includes a first touch electrode including a plurality of first touch control blocks; a second touch electrode including a plurality of second touch control blocks; and one or more reversibly deformable elastic supports between and in direct contact with a respective one of the plurality of first touch control blocks and a respective one of the plurality of second touch control blocks. Optionally, when the touch control structure is in a first state without a touch, the respective one of the plurality of first touch control blocks includes a first overlapping portion and a first margin portion abutting the first overlapping portion, and the respective one of the plurality of second touch control blocks includes a second overlapping portion and a second margin portion abutting the second overlapping portion. Optionally, an orthographic projection of the first overlapping portion on a base substrate completely overlaps with an orthographic projection of the second overlapping portion on the base substrate, resulting in a first overlapping area. Optionally, an orthographic projection of the first margin portion on the base substrate is non-overlapping with an orthographic projection of the respective one of the plurality of second touch control blocks on the base substrate. Optionally, an orthographic projection of the second margin portion on the base substrate is non-overlapping with an orthographic projection of the respective one of the plurality of first touch control blocks on the base substrate. Optionally, the first overlapping portion and the first margin portion are arranged along a direction the same as a direction along which the second margin portion and the second overlapping portion are arranged.

Figure 1:
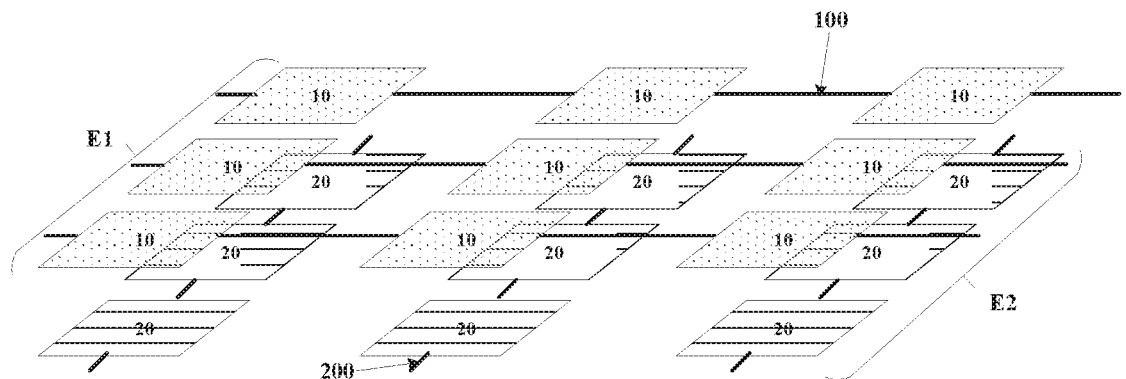
FIG. 1 is a schematic diagram of a structure of a touch control structure in some embodiments according to the present disclosure.

FIG. 1 is a schematic diagram of a structure of a touch control structure in some embodiments according to the present disclosure. In some embodiments, referring to FIG. 1, the touch control structure 01 includes a first touch electrode E1 including a plurality of first touch control blocks 10; a second touch electrode E2 including a plurality of second touch control blocks 20. Optionally, a respective one of the plurality of first touch control blocks 10 and a respective one of the plurality of second touch control blocks 20 are opposite to each other.

Optionally, the touch control structure 01 includes the first electrode E1 including a first touch control blocks 10; a second touch electrode E2 including a second touch control blocks 20.

Optionally, the first touch electrode E1 is a scanning electrode, and the second touch electrode E2 is a sensing electrode. Optionally, the first touch electrode E1 is a sensing electrode, and the second touch electrode E2 is a scanning electrode.

Figure 2A:
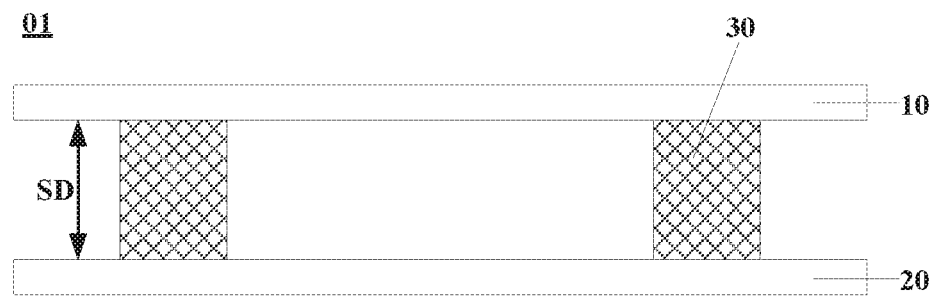
FIG. 2A is a schematic diagram of a structure of a touch control structure in some embodiments according to the present disclosure.
Figure 2B:
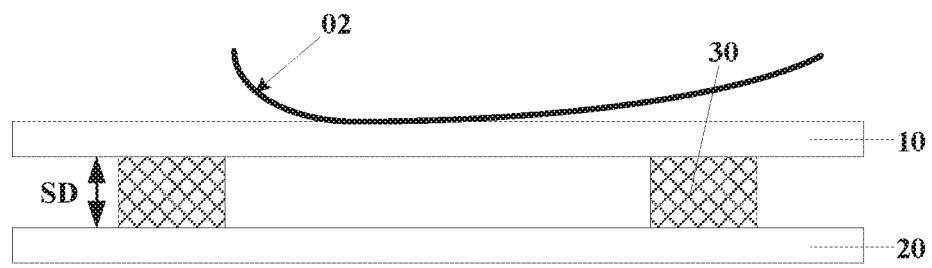
FIG. 2B is a schematic diagram of a structure of a touch control structure when a touch is applied thereon in some embodiments according to the present disclosure.

FIG. 2A is a schematic diagram of a structure of a touch control structure in some embodiments according to the present disclosure. FIG. 2B is a schematic diagram of a structure of a touch control structure when a touch is applied thereon in some embodiments according to the present disclosure. In some embodiments, referring to FIG. 1, FIG. 2A, and FIG. 2B, the touch control structure 01 includes one or more reversibly deformable elastic supports 30 between and in direct contact with a respective one of the plurality of first touch control blocks 10 and a respective one of the plurality of second touch control blocks 20.

As used herein, the term "reversibly deformable" refers to a property of a material, an object, or a construction that when the material, the object, or the construction is deformed upon application of a force, i.e., depressed or compressed, it springs substantially (e.g., within 10% error) back to its original or undeformed shape when the force is withdrawn. For example, when a force is applied on the one or more reversibly deformable elastic supports 30, the shape of the one or more reversibly deformable elastic supports 30 are changed from original shapes to deformed shapes, subsequent to removing the force from the one or more reversibly deformable elastic supports 30, the one or more reversibly deformable elastic supports 30 spring substantially back to their original shapes.

Optionally, the one or more reversibly deformable elastic supports 30 includes an insulating material. For example, the one or more reversibly deformable elastic supports 30 are made of rubber.

Optionally, the one or more reversibly deformable elastic supports 30 are configured to prevent the respective one of the plurality of first touch control blocks 10 and the respective one of the plurality of second touch control blocks 20 from contacting with each other.

Optionally, the one or more reversibly deformable elastic supports 30 is fixed on one or both of the respective one of the plurality of first touch control blocks 10 and the respective one of the plurality of second touch control blocks 20.

Optionally, the one or more reversibly deformable elastic supports 30 is not fixed on both of the respective one of the plurality of first touch control blocks 10 and the respective one of the plurality of second touch control blocks 20.

In some embodiments, referring to FIG. 2A, the respective one of the plurality of first touch control blocks 10 and two adjacent second touch control blocks 20 of the plurality of second touch control blocks 20 are spaced apart from each other by a spacing distance SD. Referring to FIG. 2B, for example, when a finger 02 is touching on the touch control structure 01, the spacing distance SD between the respective one of the plurality of first touch control blocks 10 and the respective one of the plurality of second touch control blocks 20 is reduced. Since there is a first capacitance between the respective one of the plurality of first touch control blocks 10 and the respective one of the plurality of second touch control blocks 20 without a touch, when a finger is touching on the respective one of the plurality of first touch control blocks 10, the first capacitance is changed into a second capacitance due to the contact between the finger and the respective one of the plurality of first touch control blocks 10. Based on a capacitance change between the first capacitance and the second capacitance, the touch position of the finger can be determined. Moreover, as the pressure of the touch changes, the spacing distance SD is changed, resulting in further changes of the capacitance between the respective one of the plurality of first touch control blocks 10 and the respective one of the plurality of second touch control blocks 20. For example, as the pressure increases, the capacitance also increases, so that a level of pressure can also be detected based on the change of the capacitance due to the change of the spacing distance.

The capacitance between the respective one of the plurality of first touch control blocks 10 and the respective one of the plurality of second touch control blocks 20 can be determined by the spacing distance SD and an overlapping area between the respective one of the plurality of first touch control blocks 10 and the respective one of the plurality of second touch control blocks 20. The relation between the capacitance, the spacing distance, and the overlapping areas can be shown using the following equation:

$$C \frac{\varepsilon S}{4\pi k d}; \tag{1}$$

wherein C represents an capacitance between a respective one of a plurality of first touch control blocks and a respective one of a plurality of second touch control blocks; ε represents a dielectric constant; S represents an overlapping area between the respective one of the plurality of first touch control blocks and the respective one of the plurality of second touch control blocks, for example, an overlapping area between the respective one of the plurality of first touch control blocks and the respective one of the plurality of second touch control blocks is an overlapping area in which an orthographic projection of the respective one of the plurality of first touch control blocks on a plane overlaps with an orthographic projection of the respective one of the plurality of second touch control blocks on the same plane. Optionally, the respective one of the plurality of first touch control blocks, the respective one of the plurality of second touch control blocks, and the plane are substantially parallel to each other; d represents a spacing distance between the respective one of the plurality of first touch control blocks and the respective one of the plurality of second touch control blocks, for example, the spacing distance d represents a normal distance between the respective one of the plurality of first touch control blocks and the respective one of the plurality of second touch control blocks; k represents an electrostatic force constant.

Referring to the above equation (1), as the overlapping area S increases and the spacing distance d decreases, the capacitance C increases.

Figure 3:
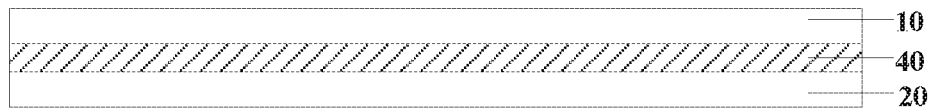
FIG. 3 is a schematic diagram of a structure of a related touch control structure.

FIG. 3 is a schematic diagram of a structure of a related touch control structure. In some embodiments, referring to FIG. 3, the touch control structure 01 includes the plurality of first touch control blocks 10; the plurality of second touch control blocks 20 opposite to the plurality of first touch control blocks 10; and an insulating layer 40 between the respective one of the plurality of first touch control blocks 10 and the respective one of the plurality of second touch control blocks 20. Optionally, the insulating layer 40 includes an inelastic material.

In some embodiments, when a touch is applied, a spacing distance SD between the respective one of the plurality of first touch control blocks 10 and the respective one of the plurality of second touch control blocks 20 does not change, or has a subtle change. Moreover, the overlapping area between the respective one of the plurality of first touch control blocks 10 and the respective one of the plurality of second touch control blocks 20 does not change or has a subtle change. So, a change of the capacitance of the touch control structure 01 is result from charges from the touch by a finger. Through this mechanism, the touch control structure can only detect a touch position, and it is not sensitive to a pressure of a touch, so that the touch control structure has a relatively low touch control sensitivity, accuracy, and precision.

In order to increase the sensitivity, accuracy, and precision of the touch control structure, in some embodiments, referring to FIG. 2A and FIG. 2B, the present disclosure provides a touch control structure 01 having the plurality of first touch control blocks 10, the plurality of second touch control blocks 20 opposite to the plurality of first touch control blocks 10, and one or more reversibly deformable elastic supports 30 between the respective one of the plurality of first touch control blocks 10 and the respective one of the plurality of second touch control blocks 20.

When a touch is applied, the capacitance of the touch control structure 01 changes due to the charges of the touch, e.g., charges of a finger, and changes of the spacing distance SD between the respective one of the plurality of first touch control blocks 10 and the respective one of the plurality of second touch control blocks 20. Since the change of capacitance depends on charges of a touch and the spacing distance DS, the change of the capacitance of the touch control structure 01 is more obvious and easier to be detected than a change of the capacitance merely due to the charges of a touch. SO, the touch control structure having a changeable spacing distance SD may have a higher sensitivity, higher accuracy, and higher precision, and will provide a good user experience.

Figure 4A:
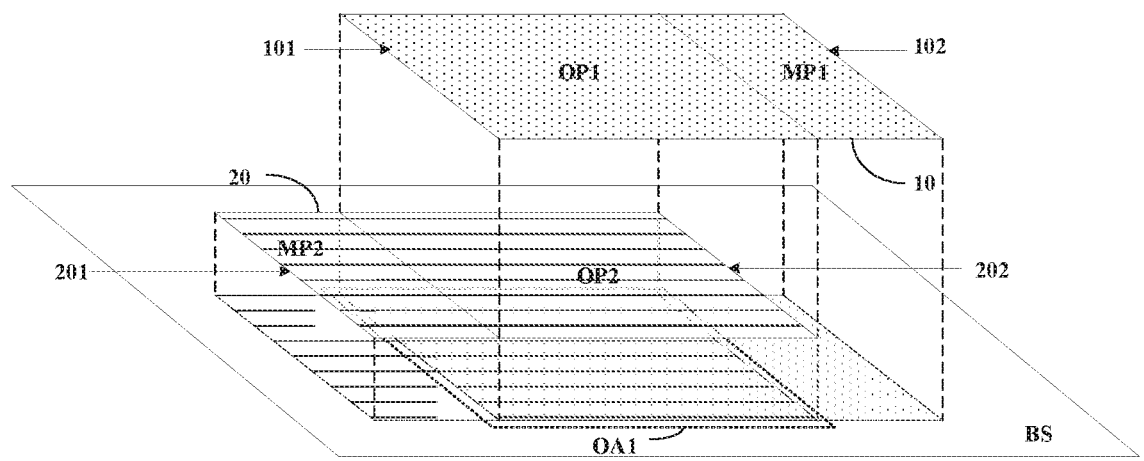
FIG. 4A is a schematic diagram showing a structure of a touch control structure in a first state without a touch in some embodiments according to the present disclosure.

FIG. 4A is a schematic diagram showing a structure of a touch control structure in some embodiments according to the present disclosure. In some embodiments, referring to FIG. 4A, when the touch control structure 01 is in a first state without a touch, the respective one of the plurality of first touch control blocks 10 includes a first overlapping portion OP1 and a first margin portion MP1 abutting the first overlapping portion OP1, and the respective one of the plurality of second touch control blocks 20 includes a second overlapping portion OP2 and a second margin portion MP2 abutting the second overlapping portion OP2.

Optionally, an orthographic projection of the first overlapping portion OP1 on a base substrate BS completely overlaps with an orthographic projection of the second overlapping portion OP2 on the base substrate BS, resulting in a first overlapping area OA1. Optionally, the respective one of the plurality of first touch control blocks, the respective one of the plurality of second touch control blocks, and the base substrate are substantially parallel to each other.

Optionally, an orthographic projection of the first margin portion MP1 on the base substrate BS is non-overlapping with an orthographic projection of the respective one of the plurality of second touch control blocks 20 on the base substrate BS. Optionally, an orthographic projection of the second margin portion MP2 on the base substrate BS is non-overlapping with an orthographic projection of the respective one of the plurality of first touch control blocks 10 on the base substrate BS.

Optionally, the first overlapping portion OP1 and the first margin portion MP1 are arranged along a direction the same as a direction along which the second margin portion MP2 and the second overlapping portion OP2 are arranged.

Figure 4B:
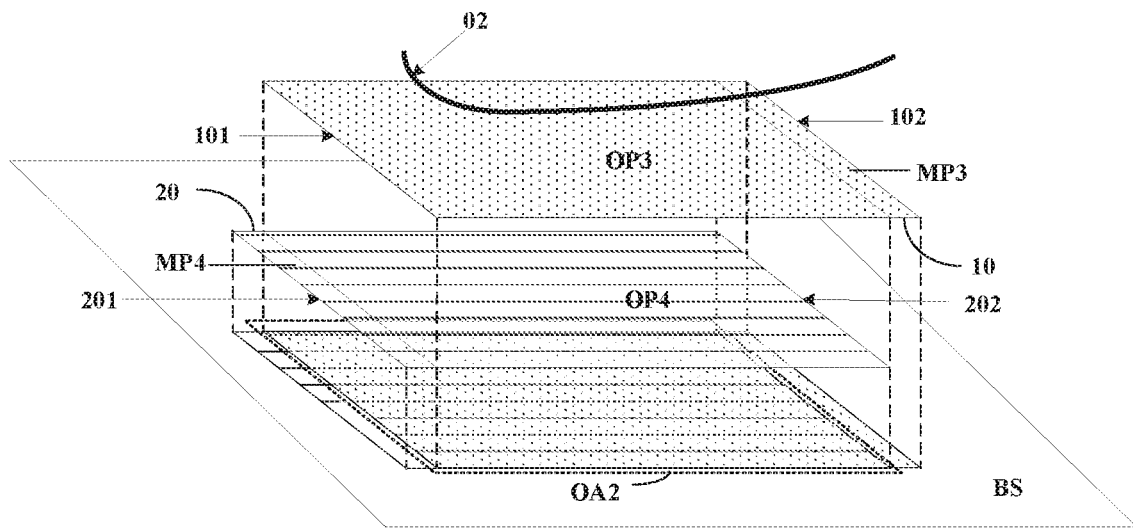
FIG. 4B is a schematic diagram showing a structure of a touch control structure in a second state upon a touch in some embodiments according to the present disclosure.

FIG. 4B is a schematic diagram showing a structure of a touch control structure in a second state upon a touch in some embodiments according to the present disclosure. In some embodiments, referring to FIG. 4B, the touch control structure 01 is in a second state upon a touch, the respective one of the plurality of first touch control blocks 10 includes a third overlapping portion OP3, and the respective one of the plurality of second touch control blocks 20 includes a fourth overlapping portion OP4.

Optionally, the respective one of the plurality of first touch control blocks 10 includes a third overlapping portion OP3 and a third margin portion MP3 abutting the third overlapping portion OP3, and the respective one of the plurality of second touch control blocks 20 includes a fourth overlapping portion OP4 and a fourth margin portion MP4 abutting the fourth overlapping portion OP4.

Optionally, an orthographic projection of the third overlapping portion OP3 on the base substrate BS completely overlaps with an orthographic projection of the fourth overlapping portion OP4 on the base substrate BS, resulting in a second overlapping area OA2.

Optionally, an orthographic projection of the third margin portion MP3 on the base substrate BS is non-overlapping with an orthographic projection of the respective one of the plurality of second touch control blocks 20 on the base substrate BS. Optionally, an orthographic projection of the fourth margin portion MP4 on the base substrate BS is non-overlapping with an orthographic projection of the respective one of the plurality of first touch control blocks 10 on the base substrate BS.

Optionally, the third overlapping portion OP3 and the third margin portion MP3 are arranged along a direction the same as a direction along which the fourth margin portion MP4 and the fourth overlapping portion OP4 are arranged.

Optionally, referring to FIG. 4A and FIG. 4B, the first overlapping area OA1 is smaller than the second overlapping area OA2.

Figure 5A:
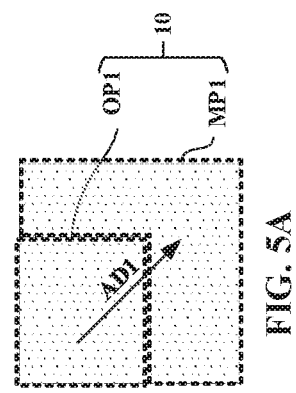
FIG. 5A is a plan view of a respective one of the plurality of first touch control blocks in some embodiments according to the present disclosure.

FIG. 5A is a plan view of a respective one of the plurality of first touch control blocks in some embodiments according to the present disclosure. In some embodiments, referring to FIG. 5A, a respective one of the plurality of first touch control blocks 10 includes a first overlapping portion OP1 and a first margin portion MP1. The first overlapping portion OP1 and the first margin portion MP1 are arranged along a first arrangement direction AD1.

Figure 5B:
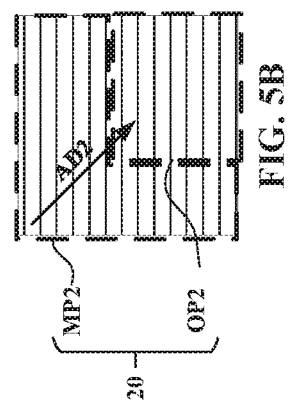
FIG. 5B is a plan view of a respective one of the plurality of second touch control blocks in some embodiments according to the present disclosure.

FIG. 5B is a plan view of a respective one of the plurality of second touch control blocks in some embodiments according to the present disclosure. In some embodiments, referring to FIG. 5B, a respective one of the plurality of second touch control blocks 20 includes a second overlapping portion OP2 and a second margin portion MP2. The second margin portion MP2 and the second overlapping portion OP2 are arranged along a second arrangement direction AD2.

Figure 5C:
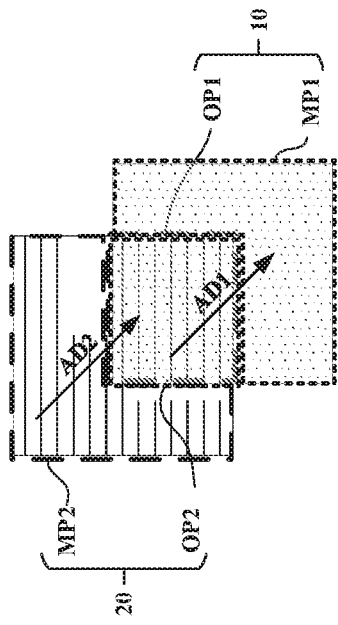
FIG. 5C is a plan view of a respective one of the plurality of first touch control blocks and a respective one of the plurality of second touch control blocks in some embodiments according to the present disclosure.

FIG. 5C is a plan view of a respective one of the plurality of first touch control blocks and a respective one of the plurality of second touch control blocks in some embodiments according to the present disclosure. In some embodiments, referring to FIG. 5A, FIG. 5B, and FIG. 5C, the first overlapping portion OP1 and the first margin portion MP1 are arranged along a direction (e.g. the first arrangement direction AD1) the same as a direction (e.g., the second arrangement direction AD2) along which the second margin portion MP2 and the second overlapping portion OP2 are arranged. The first arrangement direction AD1 and the second arrangement direction AD2 are the same.

Figure 6A:
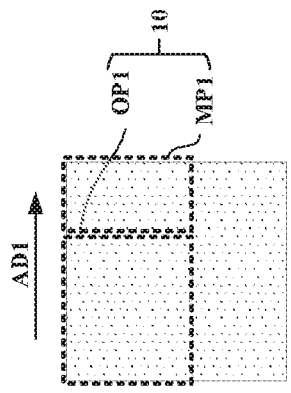
FIG. 6A is a plan view of a respective one of the plurality of first touch control blocks in some embodiments according to the present disclosure.

FIG. 6A is a plan view of a respective one of the plurality of first touch control blocks in some embodiments according to the present disclosure. In some embodiments, referring to FIG. 6A, a respective one of the plurality of first touch control blocks 10 includes a first overlapping portion OP1 and a first margin portion MP1. The first overlapping portion OP1 and the first margin portion MP1 are arranged along a first arrangement direction AD1.

Figure 6B:
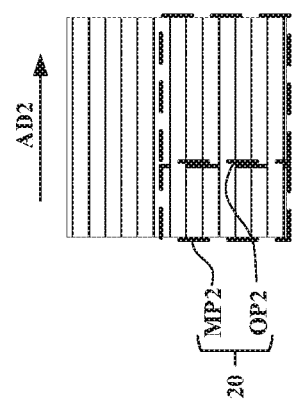
FIG. 6B is a plan view of a respective one of the plurality of second touch control blocks in some embodiments according to the present disclosure.

FIG. 6B is a plan view of a respective one of the plurality of second touch control blocks in some embodiments according to the present disclosure. In some embodiments, referring to FIG. 6B, a respective one of the plurality of second touch control blocks 20 includes a second overlapping portion OP2 and a second margin portion MP2. The second margin portion MP2 and the second overlapping portion OP2 are arranged along a second arrangement direction AD2.

Figure 6C:
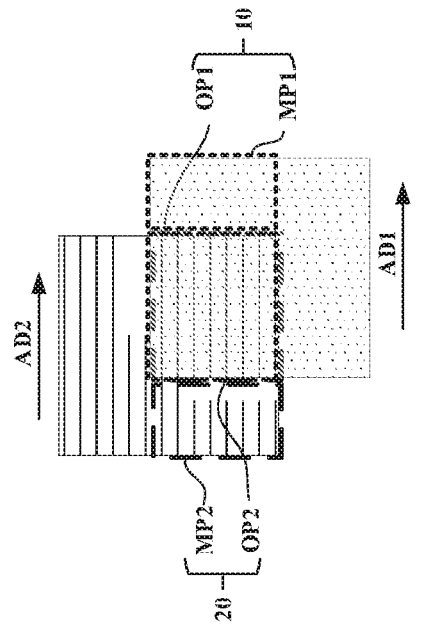
FIG. 6C is a plan view of a respective one of the plurality of first touch control blocks and a respective one of the plurality of second touch control blocks in some embodiments according to the present disclosure.

FIG. 6C is a plan view of a respective one of the plurality of first touch control blocks and a respective one of the plurality of second touch control blocks in some embodiments according to the present disclosure. In some embodiments, referring to FIG. 6A, FIG. 6B, and FIG. 6C, the first overlapping portion OP1 and the first margin portion MP1 are arranged along a direction (e.g. the first arrangement direction AD1) the same as a direction (e.g., the second arrangement direction AD2) along which the second margin portion MP2 and the second overlapping portion OP2 are arranged. The first arrangement direction AD1 and the second arrangement direction AD2 are the same.

Figure 7A:
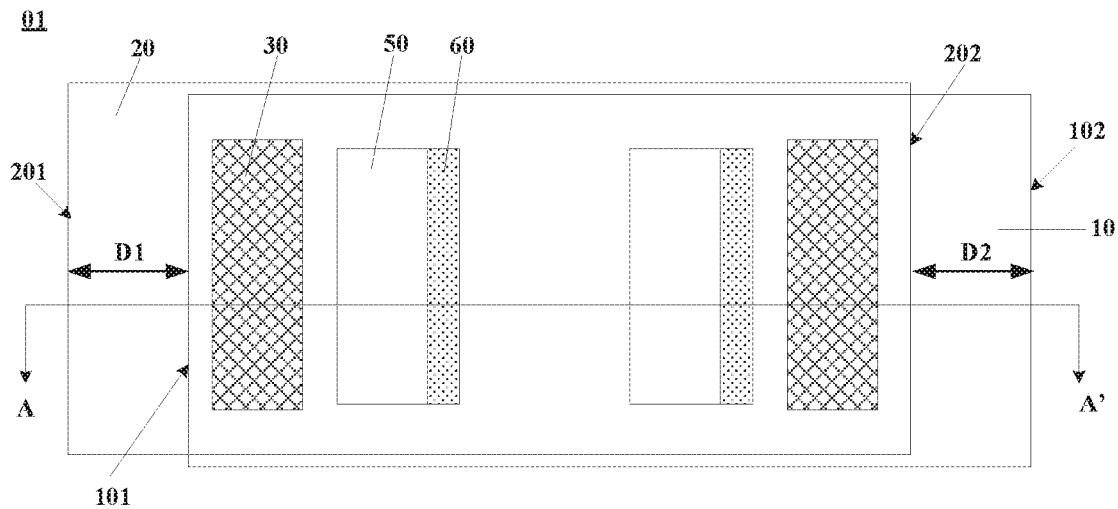
FIG. 7A is a plan view of a touch control structure in a first state without a touch in some embodiments according to the present disclosure.
Figure 7B:
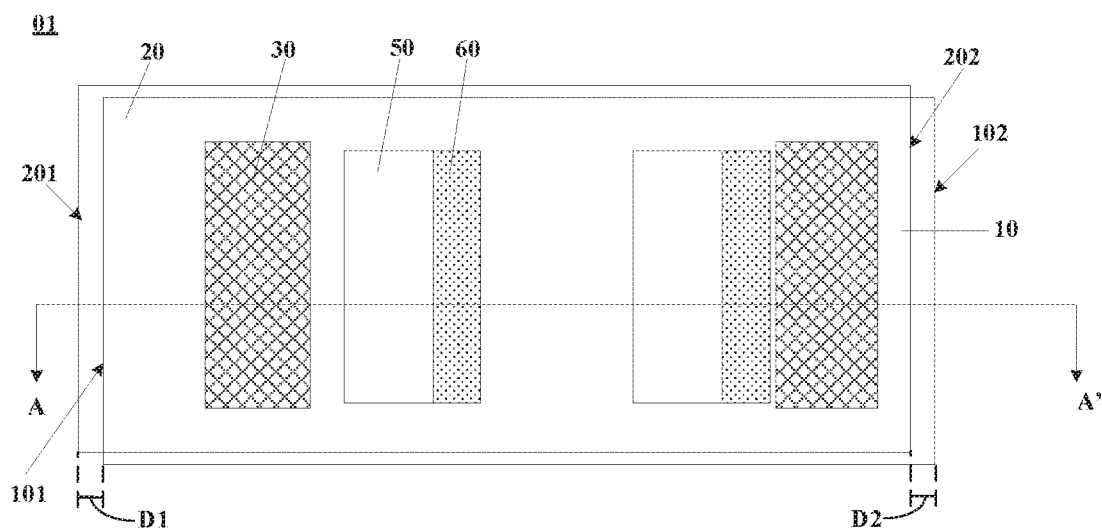
FIG. 7B is a plan view of a touch control structure in a second state upon a touch in some embodiments according to the present disclosure.

FIG. 7A is a plan view of a touch control structure in a first state without a touch in some embodiments according to the present disclosure. FIG. 7B is a plan view of a touch control structure in a second state upon a touch in some embodiments according to the present disclosure. In some embodiments, referring to FIG. 7A and FIG. 7B, the respective one of the plurality of first touch control blocks 10 included a first side 101 and a second side 102 opposite to the first side 101. Optionally, the respective one of the plurality of second touch control blocks 20 includes a third side 201 and the fourth side 202 opposite to the third side 201.

Optionally, the first side 101 and the third side 201 are on a same side of the combination of the respective one of the plurality of first touch control blocks 10 and the respective one of the plurality of second touch control blocks 20. Optionally, the second side 102 and the fourth side 202 are on a same side of the combination of the respective one of the plurality of first touch control blocks 10 and the respective one of the plurality of second touch control blocks 20 but opposite to the side where the first side 101 and the third side 201 are. Optionally, the third side 201, the first side 101, the fourth side 202, and the second side 102 are arranged in order.

In some embodiments, referring to FIG. 7A, in the first state, an orthographic projection of at least a portion of the first side 101 on the respective one of the plurality of second touch control blocks 20 is between the third side 201 and the fourth side 202. Optionally, an orthographic projection of at least a portion of the fourth side 202 on the respective one of the plurality of first touch control blocks 10 is between the first side 101 and the second side 102.

In some embodiments, referring to FIG. 7A and FIG. 7B, a first distance D1 between the orthographic projection of the first side 101 on the respective one of the plurality of second touch control blocks 20 and the third side 201 decreases from the first state shown in FIG. 7A to the second state shown in FIG. 7B; and a second distance D2 between the second side 102 and the orthographic projection of the fourth side 202 on the respective one of the plurality of first touch control blocks 10 decreases from the first state shown in FIG. 7A to the second state shown in FIG. 7B.

Optionally, the first distance D1 is a maximum distance between the orthographic projection of the first side 101 on the respective one of the plurality of second touch control blocks 20 and the third side 201. Optionally, the first distance D1 is a minimum distance between the orthographic projection of the first side 101 on the respective one of the plurality of second touch control blocks 20 and the third side 201. Optionally, the first distance D1 is an average distance between the orthographic projection of the first side 101 on the respective one of the plurality of second touch control blocks 20 and the third side 201.

Optionally, the second distance D2 is a maximum distance between the second side 102 and the orthographic projection of the fourth side 202 on the respective one of the plurality of first touch control blocks 10. Optionally, the second distance D2 is a minimum distance between the second side 102 and the orthographic projection of the fourth side 202 on the respective one of the plurality of first touch control blocks 10. Optionally, the second distance D2 is an average distance between the second side 102 and the orthographic projection of the fourth side 202 on the respective one of the plurality of first touch control blocks 10.

Figure 8A:
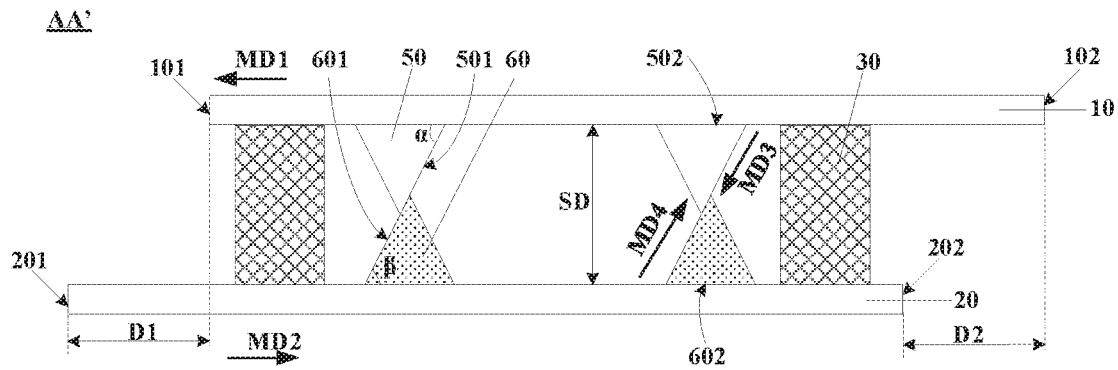
FIG. 8A is a cross-sectional view of a touch control structure along an AA' line in FIG. 7A.
Figure 8B:
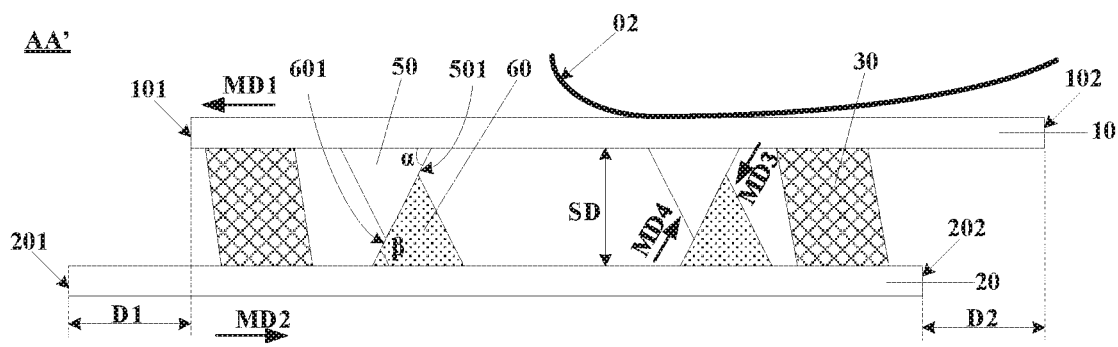
FIG. 8B is a cross-sectional view of a touch control structure along an AA' line in FIG. 7B.

FIG. 8A is a cross-sectional view of a touch control structure along an AA' line in FIG. 7A. FIG. 8B is a cross-sectional view of a touch control structure along an AA' line in FIG. 7B. In some embodiments, referring to FIG. 8A and FIG. 8B, the touch control structure 01 further includes a first movement guiding protrusion 50 protruding from a surface of the respective one of the plurality of first touch control blocks 10 toward the respective one of the plurality of second touch control blocks 20; and a second movement guiding protrusion 60 protruding from a surface of the respective one of the plurality of second touch control blocks 20 toward the respective one of the plurality of first touch control blocks 10. For example, the first movement guiding protrusion 50 is fixed on the surface of the respective one of the plurality of first touch control blocks 10, and the second movement guiding protrusion 60 is fixed on the surface of the respective one of the plurality of second touch control blocks 20. Optionally, a distance between the first side 101 and an orthographic projection of the first movement guiding protrusion 50 on the respective one of the plurality of first touch control blocks 10 is smaller than a distance between the first side 101 and an orthographic projection of the second movement guiding protrusion 60 on the respective one of the plurality of second touch control blocks 20.

During at least a sub-period of a period during which the touch control structure 01 transition from the first state to the second state, the first movement guiding protrusion 50 is configured to guide the respective one of the plurality of first touch control blocks 10 to move relative to the respective one of the plurality of second touch control blocks 20 along a first relative moving direction MD1 opposite to a second relative moving direction MD2 along which the second movement guiding protrusion 60 is configured to guide the respective one of the plurality of second touch control blocks 20 to move relative to the respective one of the plurality of first touch control blocks 10.

During the at least the sub-period, the spacing distance SD is positively correlated to the first distance D1, and positively correlated to the second distance D2. Optionally, the spacing distance SD is a normal distance between the respective one of the plurality of first touch control blocks 10 and the respective one of the plurality of second touch control blocks 20. For example, during the at least the sub-period, when the spacing distance SD decreases, the first distance D1 and the second distance D2 decrease.

Optionally, referring to FIG. 4A. FIG. 4B, FIG. 8A and FIG. 8B, an area of an overlapping area, formed by the orthographic projections of respective portions of the respective one of the plurality of first touch control blocks 10 and the respective one of the plurality of second touch control blocks 20 on the base substrate BS completely overlaps with each other, is negatively correlated to the first distance D1, negatively correlated to the second distance D2, and negatively correlated to the spacing distance SD. For example, during the at least the sub-period, when the spacing distance SD decreases, the area of an overlapping area increases; when the first distance D1 decreases, the area of an overlapping area increases; when the second distance D2 decreases, the area of an overlapping area increases.

Optionally, a total number of the first movement guiding protrusions on the respective one of the plurality of the first touch control blocks can be determined based on sizes of the first movement guiding protrusions and a size of the respective one of the plurality of first touch control blocks. Optionally, a total number of the second movement guiding protrusion on the respective one of the plurality of the second touch control blocks can be determined based on sizes of the second movement guiding protrusions and a size of the respective one of the plurality of second touch control blocks.

Optionally, the first movement guiding protrusion and the second movement guiding protrusion include an insulating material. Various appropriate materials may be used for making the first movement guiding protrusion and the second movement guiding protrusion. Examples of materials suitable for making the first movement guiding protrusion and the second movement guiding protrusion include, but are not limited to, silicon nitride (SiNx), silicon oxide (SiOx) or silicon oxynitride (SiOxNy).

In one example, the first movement guiding protrusion 50 and the second movement guiding protrusion 60 include a same material. In another example, a material of the first movement guiding protrusion 50 and a material of the second movement guiding protrusion 60 are different.

In some embodiments, referring to FIG. 8A and FIG. 8B, when a touch is applied, the first movement guiding protrusion 50 moves relative to the second movement guiding protrusion 60 along the third relative moving direction MD3 opposite to a fourth relative moving direction MD4 along which the second movement guiding protrusion 60 moves relative to the first movement guiding protrusion 50. Optionally, when the touch is applied, the one or more reversibly deformable elastic supports are deformed by two forces including a force perpendicular to the surface of the respective one of the plurality of first touch control blocks 10 and the surface of the respective one of the plurality of second touch control blocks 20, and a force substantially parallel to the surface of the respective one of the plurality of first touch control blocks 10 and the surface of the respective one of the plurality of second touch control blocks 20.

In some embodiments, when the touch is applied, the first movement guiding protrusion 50 guides the respective one of the plurality of first touch control blocks 10 to move relative to the respective one of the plurality of second touch control blocks 20 along the first relative moving direction MD1 opposite to the second relative moving direction MD2 along which the second movement guiding protrusion 60 guides the respective one of the plurality of second touch control blocks 20 to move relative to the respective one of the plurality of first touch control blocks 10. For example, the first relative moving direction MD1 and the second relative moving direction MD2 are both substantially parallel to the surface of the respective one of the plurality of first touch control blocks 10 and the surface of the respective one of the plurality of second touch control blocks 20. Due to relative movements between the respective one of the plurality of first touch control blocks 10 and the respective one of the plurality of second touch control blocks 20, the spacing distance SD, the first distance D1, and the second distance D2 change, and the overlapping area OA, formed by the orthographic projections of respective portions of the respective one of the plurality of first touch control blocks 10 and the respective one of the plurality of second touch control blocks 20 on the base substrate BS completely overlaps with each other, changes.

Optionally, during the at least the sub-period of a period during which the touch control structure transition from the first state (shown in FIG. 8A) to the second state (shown in FIG. 8B), the relative movements between the respective one of the plurality of first touch control blocks 10 and the respective one of the plurality of second touch control blocks 20 occurs; the spacing distance SD decreases, the first distance D1 decreases, the second distance D2 decreases, the overlapping area OA, formed by the orthographic projections of respective portions of the respective one of the plurality of first touch control blocks 10 and the respective one of the plurality of second touch control blocks 20 on the base substrate BS completely overlaps with each other, increases. Since the spacing distance SD decrease, the overlapping area OA increases, according to equation (1), the capacitance between the respective one of the plurality of first touch control blocks and the respective one of the plurality of second touch control blocks increases. The increase rate of the capacitance due to the decrease of the spacing distance and the increase of the overlapping area is greater than the increase rate of the capacitances due to merely the decrease of the spacing distance, so that, the sensitivity, the accuracy, and the precision of the touch control structure which has a changeable spacing distance, and a changeable overlapping area can be further improved.

FIG. 9A to FIG. 9F is a schematic diagram of structures of a first movement guiding protrusion and a second movement guiding protrusion in some embodiments according to the present disclosure. In some embodiments, referring to FIG. 8A, FIG. 9A to FIG. 9F, the first movement guiding protrusion 50 includes a first guiding surface 501 in direct contact with the second movement guiding protrusion 60 in at least one of the first state or the second state. Optionally, during the at least the sub-period, the second movement guiding protrusion 60 undergoes a relative movement, along the first guiding surface 501, with respect to the first movement guiding protrusion 50.

In some embodiments, the second movement guiding protrusion 60 has a second guiding surface 601 in direct contact with the first movement guiding protrusion 50 in at least one of the first state or the second state. Optionally, during the at least the sub-period, the first movement guiding protrusion 50 undergoes a relative movement, along the second guiding surface 601, with respect to the second movement guiding protrusion 60.

Various shapes may be adopted by the first movement guiding protrusion. Examples of shapes suitable to be adopted by the first movement guiding protrusion include, but are not limited to, a triangular prism, a parallel hexahedron, partial spherical shapes, and a stick shape.

Various shapes may be adopted by the second movement guiding protrusion. Examples of shapes suitable to be adopted by the second movement guiding protrusion include, but are not limited to, a triangular prism, a parallel hexahedron, partial spherical shapes, and a stick shape.

Figure 10A:
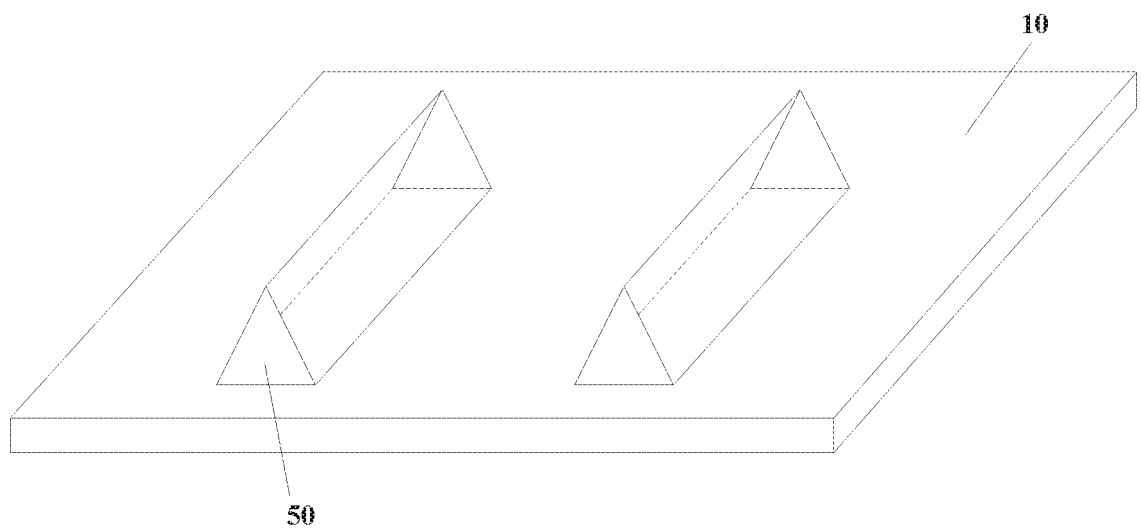
FIG. 10A is a schematic diagram of a structure of a first movement guiding protrusion in some embodiments according to the present disclosure.
Figure 10B:
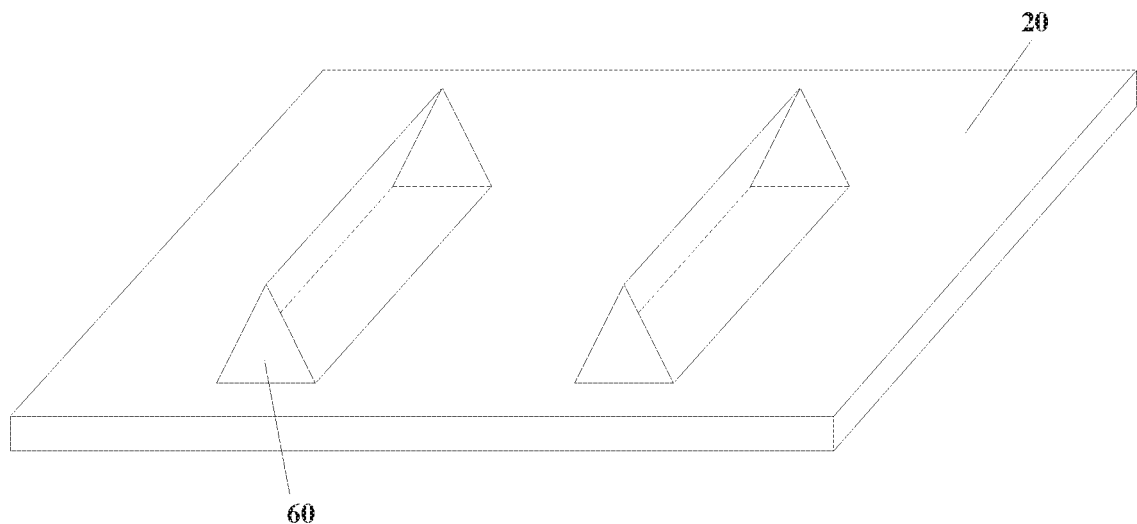
FIG. 10B is a schematic diagram of a structure of a second movement guiding protrusion in some embodiments according to the present disclosure.
Figure 11:
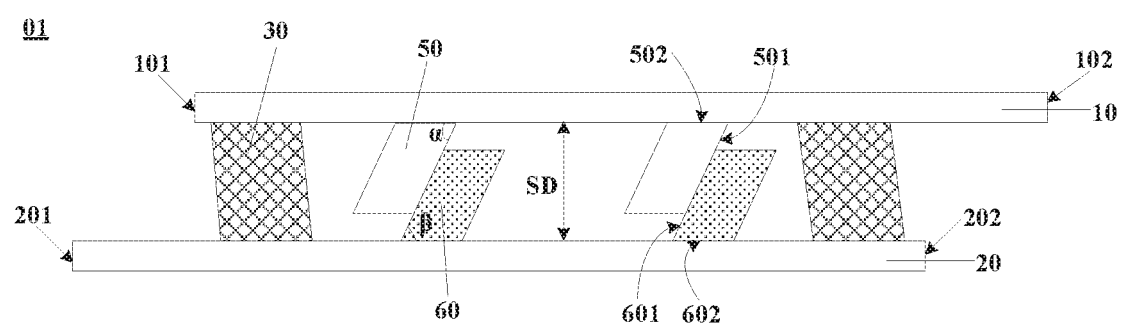
FIG. 11 is a schematic diagram of a structure of a touch control structure in some embodiments according to the present disclosure.
Figure 12A:
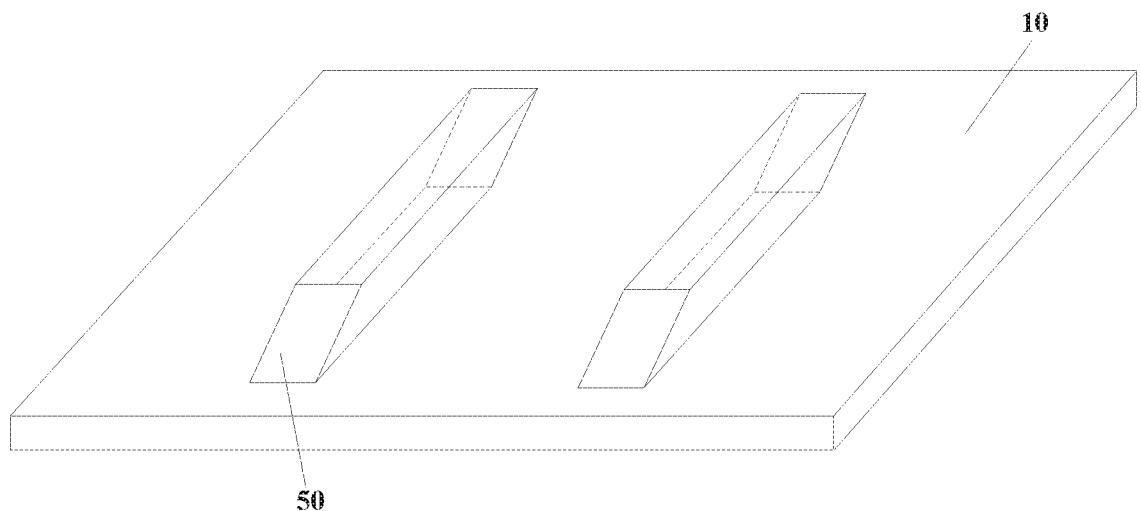
FIG. 12A is a schematic diagram of a structure of a first movement guiding protrusion in some embodiments according to the present disclosure.
Figure 12B:
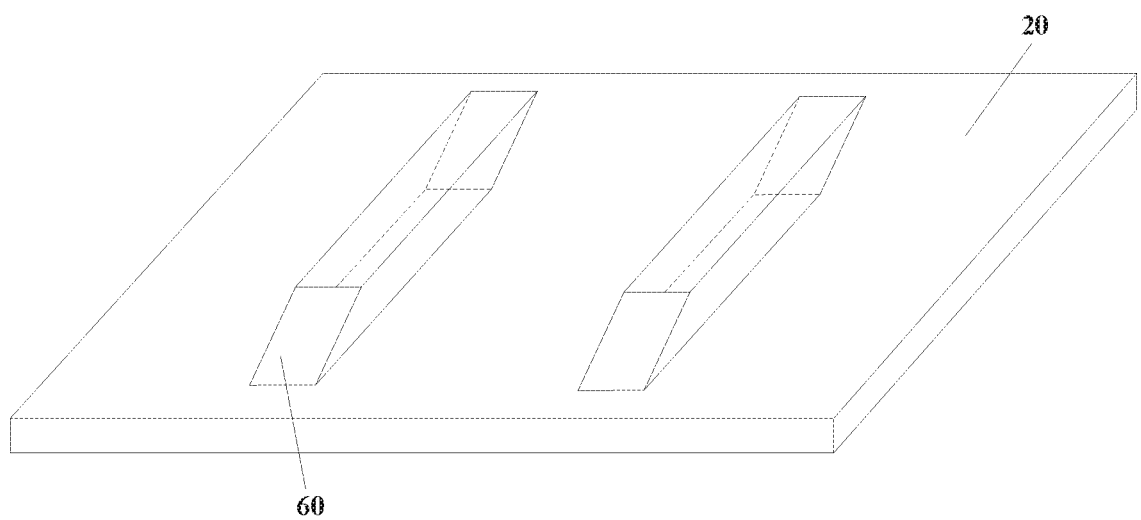
FIG. 12B is a schematic diagram of a structure of a second movement guiding protrusion in some embodiments according to the present disclosure.

FIG. 10A is a schematic diagram of a structure of a first movement guiding protrusion in some embodiments according to the present disclosure. FIG. 10B is a schematic diagram of a structure of a second movement guiding protrusion in some embodiments according to the present disclosure. FIG. 11 is a schematic diagram of a structure of a touch control structure in some embodiments according to the present disclosure. FIG. 12A is a schematic diagram of a structure of a first movement guiding protrusion in some embodiments according to the present disclosure. FIG. 12B is a schematic diagram of a structure of a second movement guiding protrusion in some embodiments according to the present disclosure.

Figure 9A:
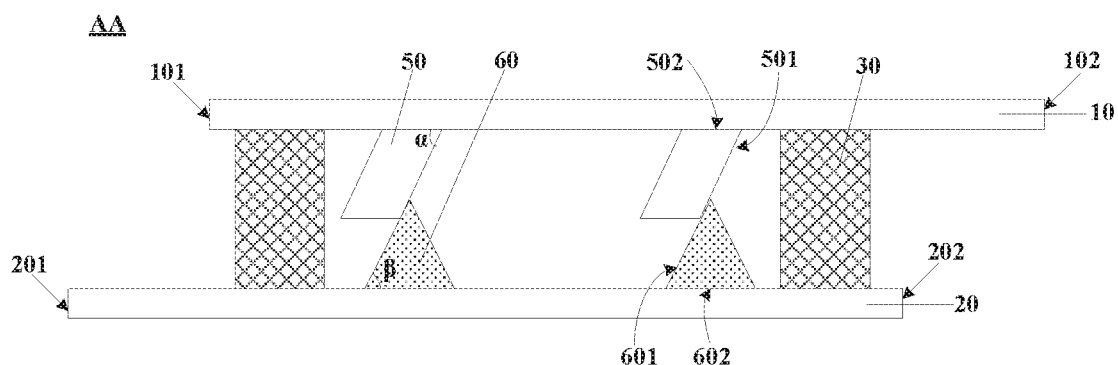
FIG. 9A is a schematic diagram of structures of a first movement guiding protrusion and a second movement guiding protrusion in some embodiments according to the present disclosure.
Figure 9B:
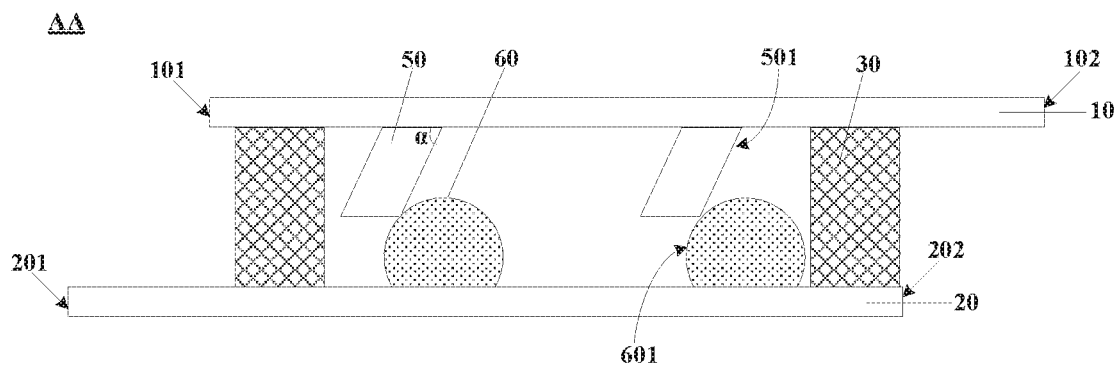
FIG. 9B is a schematic diagram of structures of a first movement guiding protrusion and a second movement guiding protrusion in some embodiments according to the present disclosure.
Figure 9C:
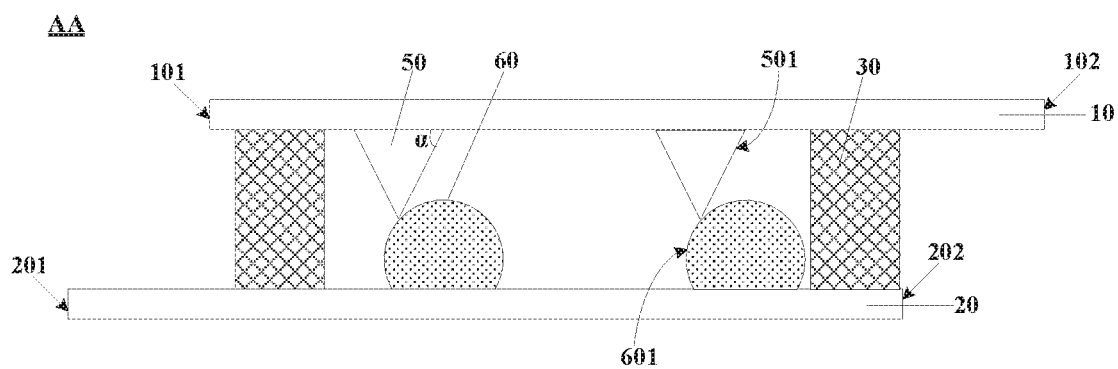
FIG. 9C is a schematic diagram of structures of a first movement guiding protrusion and a second movement guiding protrusion in some embodiments according to the present disclosure.
Figure 9D:
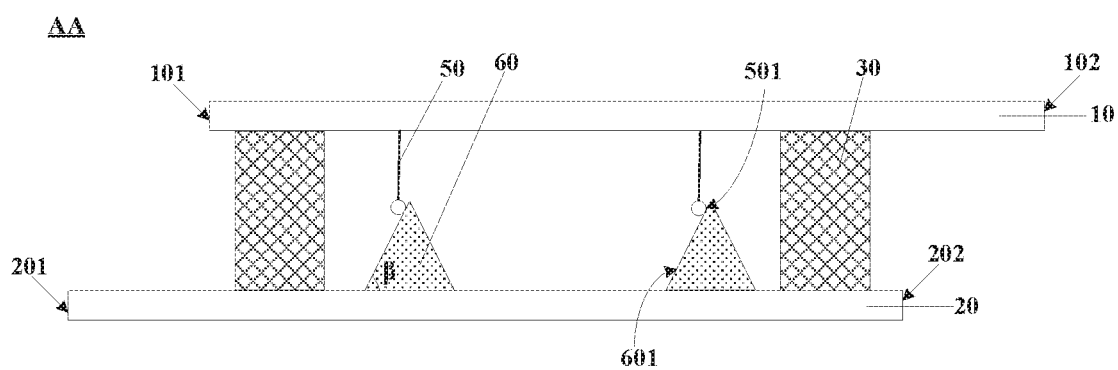
FIG. 9D is a schematic diagram of structures of a first movement guiding protrusion and a second movement guiding protrusion in some embodiments according to the present disclosure.
Figure 9E:
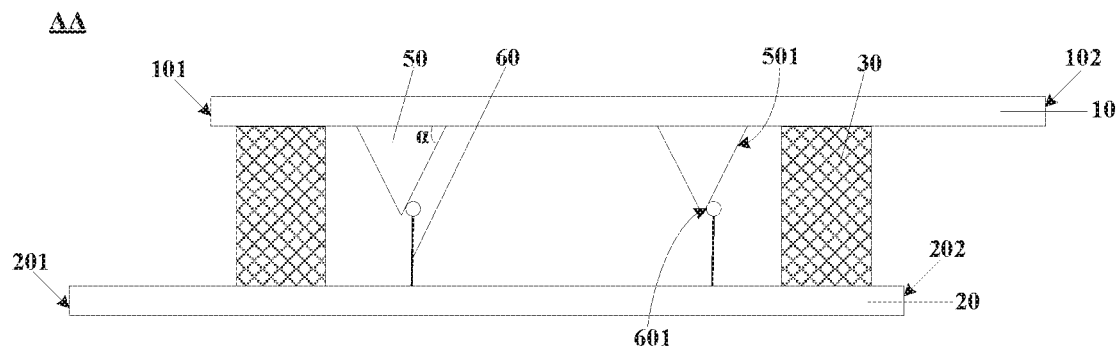
FIG. 9E is a schematic diagram of structures of a first movement guiding protrusion and a second movement guiding protrusion in some embodiments according to the present disclosure.
Figure 9F:
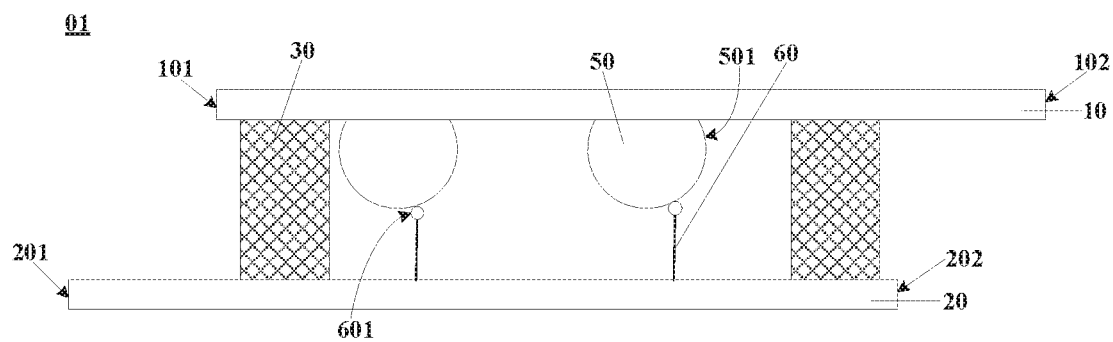
FIG. 9F is a schematic diagram of structures of a first movement guiding protrusion and a second movement guiding protrusion in some embodiments according to the present disclosure.

In some embodiments, referring to FIG. 8A, FIG. 9A, and FIG. 11, the first movement guiding protrusion 50 includes a first guiding surface 501, and the second movement guiding protrusion 60 includes a second guiding surface 601. Optionally, planes respectively containing the first guiding surface 501 and the second guiding surface 601 are substantially parallel to each other. Optionally, a first included angle $\alpha$ between the first guiding surface 501 and a first contacting interface 502 between the first movement guiding protrusion 50 and the respective one of the plurality of first touch control blocks 10 is an acute angle. Optionally, a second included angle $\beta$ between the second guiding surface 601 and a second contacting interface 602 between the second movement guiding protrusion 60 and the respective one of the plurality of second touch control blocks 20 is an acute angle.

As used herein, the term "substantially parallel" refers to two planes forming a dihedral angle between them, and the dihedral angle is in a range of 0 degree to approximately 15 degrees, e.g., 0 degree to approximately 1 degree, approximately 1 degree to approximately 2 degrees, approximately 2 degree to approximately 5 degrees, approximately 5 degree to approximately 10 degrees, approximately 10 degree to approximately 15 degrees, and 0 degree.

Since the first included angle and the second included angle are acute angle, and the first guiding surface and the second guiding surface are substantially parallel to each other and in direct contact with each other, when a touch is applied, the first movement guiding protrusion and the second movement guiding protrusion move along two opposite directions, which guides the respective one of the plurality of first touch control blocks and the respective one of the plurality of second touch control blocks to also move along two opposite directions. The arrangements about the first guiding surface and the second guiding surface ensures that when a touch is applied, the spacing distance between the respective one of the plurality of first touch control blocks and the respective one of the plurality of second touch control blocks decreases, the first distance and the second distance decrease, and the overlapping area increases.

Optionally, the first movement guiding protrusion and the second movement guiding protrusion can have various shapes, as long as the planes respectively containing the first guiding surface and the second guiding surface are substantially parallel to each other.

In one example, referring to FIG. 8A, FIG. 10A, and FIG. 10B, the first movement guiding protrusion 50 and the second movement guiding protrusion 60 are triangular prisms. For example, along a plane perpendicular to the respective one of the plurality of first touch control blocks and the respective one of the plurality of second touch control blocks, and intersecting the one or more reversibly deformable electric supports, a cross section of the first movement guiding protrusion 50 and a cross section of the second movement guiding protrusion 60 are triangles.

In another example, referring to FIG. 11, FIG. 12A, and FIG. 12B, the first movement guiding protrusion 50 and the second movement guiding protrusion 60 are parallel hexahedrons. For example, along the plane perpendicular to the respective one of the plurality of first touch control blocks and the respective one of the plurality of second touch control blocks, and intersecting the one or more reversibly deformable electric supports, the cross section of the first movement guiding protrusion 50 and the cross section of the second movement guiding protrusion 60 are parallelograms.

Optionally, the first movement guiding protrusion and the second movement guiding protrusion have a same shape. Optionally, the first movement guiding protrusion and the second movement guiding protrusion have different shapes.

Figure 13:
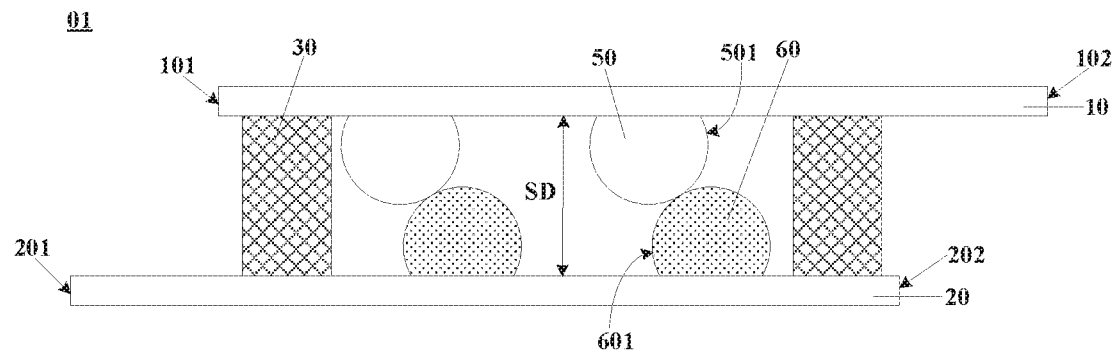
FIG. 13 is a schematic diagram of a structure of a touch control structure in some embodiments according to the present disclosure.
Figure 14:
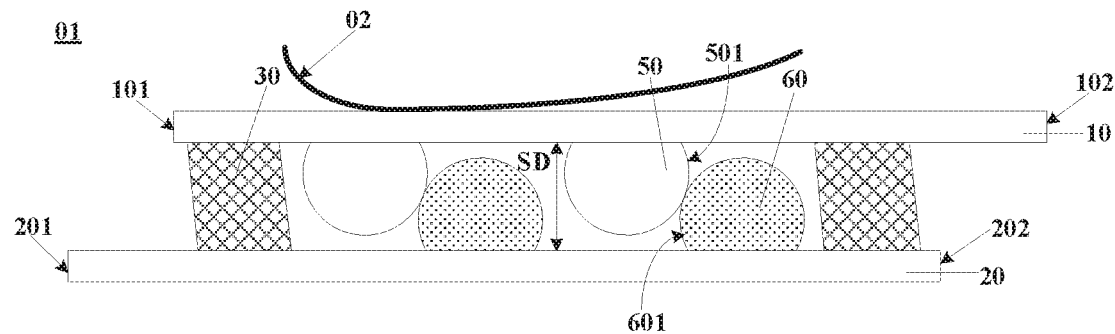
FIG. 14 is a schematic diagram of a structure of a touch control structure when a touch is applied thereon in some embodiments according to the present disclosure.

FIG. 13 is a schematic diagram of a structure of a touch control structure in some embodiments according to the present disclosure. FIG. 14 is a schematic diagram of a structure of a touch control structure when a touch is applied thereon in some embodiments according to the present disclosure.

Referring to FIG. 13 and FIG. 14, in some embodiments, the first movement guiding protrusion 50 has a first guiding surface 501 in direct contact with the second movement guiding protrusion 60 in at least one of the first state or the second state. Optionally, the second movement guiding protrusion 60 has a second guiding surface 601 in direct contact with the first movement guiding protrusion 50 in at least one of the first state or the second state. Optionally, the first guiding surface 501 and the second guiding surface 601 are convex surfaces.

For example, when a touch is applied, the first movement guiding protrusion and the second movement guiding protrusion move along two opposite directions, which guides the respective one of the plurality of first touch control blocks and the respective one of the plurality of second touch control blocks to also move along two opposite directions. The arrangements about the first guiding surface and the second guiding surface ensures that when a touch is applied, the spacing distance between the respective one of the plurality of first touch control blocks and the respective one of the plurality of second touch control blocks decreases, the first distance and the second distance decrease, and the overlapping area increases.

Optionally, along the plane perpendicular to the respective one of the plurality of first touch control blocks 10 and the respective one of the plurality of second touch control blocks 20, and intersecting the one or more reversibly deformable elastic supports 30, the cross section of the first movement guiding protrusion 50 and the cross section of the second movement guiding protrusion 60 are partial circular shapes.

Figure 15A:
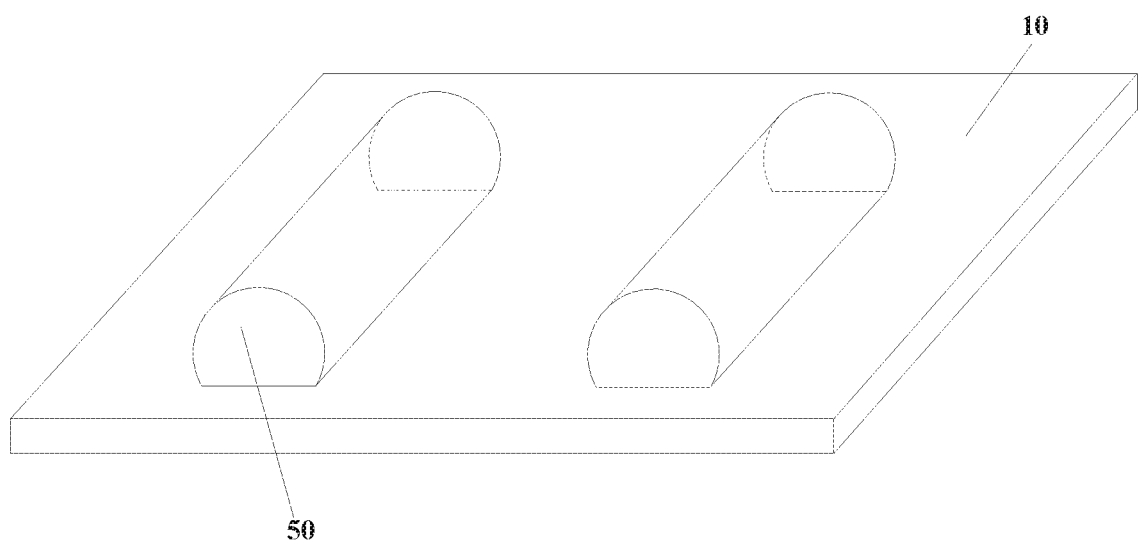
FIG. 15A is schematic diagram of a structure of a first movement guiding protrusion in some embodiments according to the present disclosure.
Figure 15B:
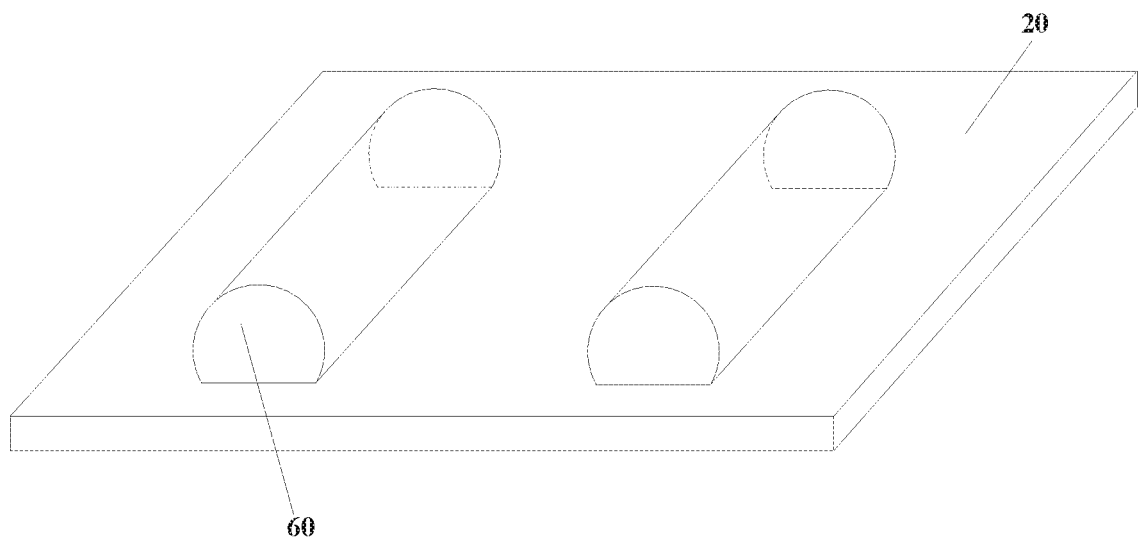
FIG. 15B is schematic diagram of a structure of a second movement guiding protrusion in some embodiments according to the present disclosure.

FIG. 15A is schematic diagram of a structure of a first movement guiding protrusion in some embodiments according to the present disclosure. FIG. 15B is schematic diagram of a structure of a second movement guiding protrusion in some embodiments according to the present disclosure. In some embodiments, referring to FIG. 15A and FIG. 15B, the first movement guiding protrusion 50 and the second movement guiding protrusion 60 are partial cylinders. For example, along the plane perpendicular to the respective one of the plurality of first touch control blocks 10 and the respective one of the plurality of second touch control blocks 20, and intersecting the one or more reversibly deformable elastic supports 30, the cross section of the first movement guiding protrusion 50 and the cross section of the second movement guiding protrusion 60 are partial circular shapes.

Figure 16A:
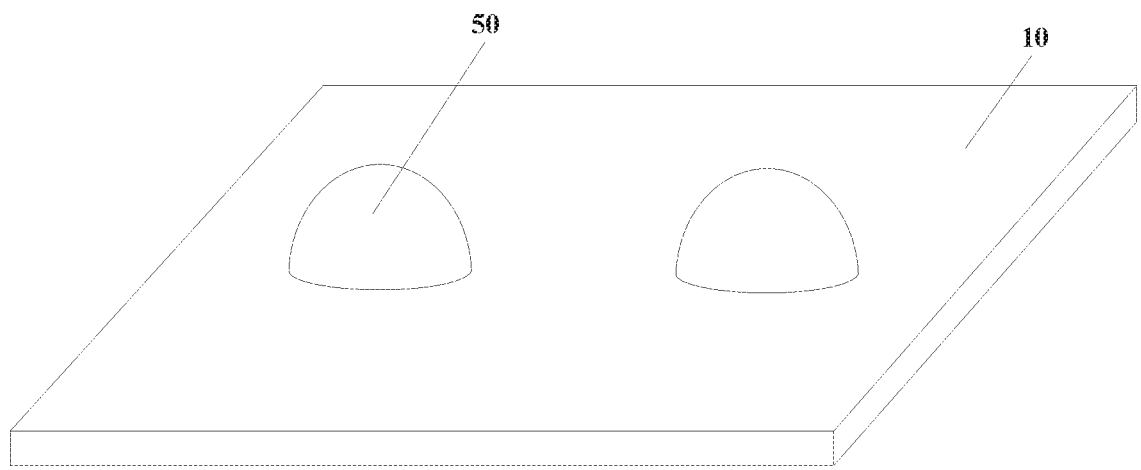
FIG. 16A is schematic diagram of a structure of a first movement guiding protrusion in some embodiments according to the present disclosure.
Figure 16B:
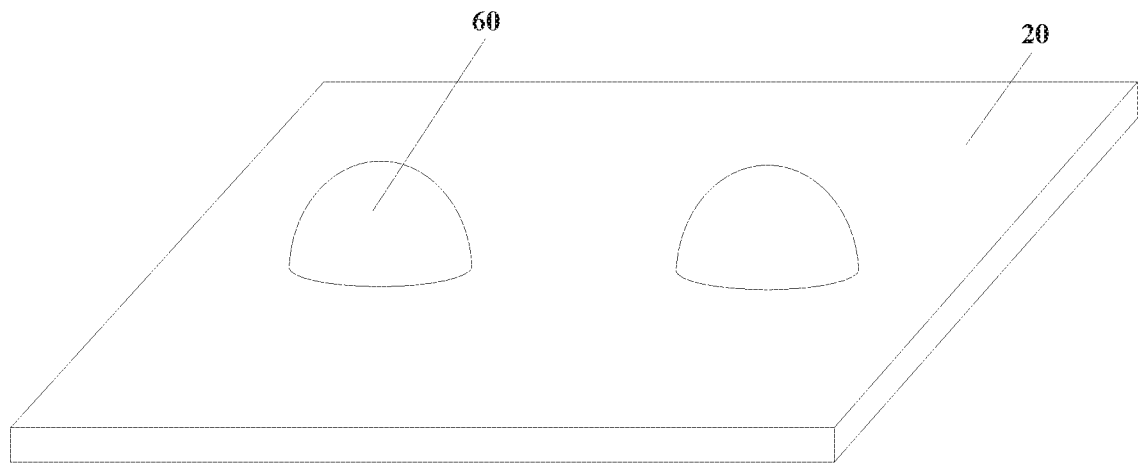
FIG. 16B is schematic diagram of a structure of a second movement guiding protrusion in some embodiments according to the present disclosure.

FIG. 16A is schematic diagram of a structure of a first movement guiding protrusion in some embodiments according to the present disclosure. FIG. 16B is schematic diagram of a structure of a second movement guiding protrusion in some embodiments according to the present disclosure. In some embodiments, referring to FIG. 16A and FIG. 16B, the first movement guiding protrusion 50 and the second movement guiding protrusion 60 are partial spherical shapes. For example, along a plane perpendicular to the respective one of the plurality of first touch control blocks 10 and perpendicular to the respective one of the plurality of second touch control blocks 20, a cross section of the first movement guiding protrusion 50 and a cross section of the second movement guiding protrusion 60 are partial circular shapes.

Various appropriate methods may be used for forming the first movement guiding protrusion and the second movement guiding protrusion. Optionally, the first movement guiding protrusion and the second movement guiding protrusion are formed prior to disposing them respectively on the respective one of the plurality of first touch control blocks and the respective one of the plurality of second touch control blocks.

Optionally, forming the first movement guiding protrusion includes forming a first insulating material layer on the respective one of the plurality of first touch control blocks; patterning the first insulating material layer using Multi-Tone Mask (MTM) to form the first movement guiding protrusion. Forming the second movement guiding protrusion includes forming a second insulating material layer on the respective one of the plurality of second touch control blocks; patterning the second insulating material layer using Multi-Tone Mask (MTM) to form the second movement guiding protrusion. The patterning process includes coating photoresist, exposing, developing, etching, and stripping the photoresist. Optionally, subsequent to forming the first movement guiding protrusion on the respective one of the plurality of first touch control blocks, and forming the second movement guiding protrusion on the respective one of the plurality of second touch control blocks, the respective one of the plurality of first touch control blocks and the respective one of the plurality of second touch control blocks are aligned to form the touch control structure.

Optionally, prior to aligning the respective one of the plurality of first touch control blocks and the respective one of the plurality of second touch control blocks, the one or more reversibly deformable elastic supports are formed. Forming the one or more reversibly deformable elastic supports includes forming an elastic material layer on a side of the respective one of the plurality of first touch control blocks closer to the respective one of the plurality of second touch control blocks using spin-coating; and etching the elastic materials layer to form the one or more reversibly deformable elastic supports.

In another aspect, the present disclosure provides a method of detecting a touch using a touch control structure. In some embodiments, the touch control structure includes a first touch electrode having a plurality of first touch control blocks; a second touch electrode having a plurality of second touch control blocks, the plurality of first touch control blocks respectively opposite to the plurality of second touch control blocks; and one or more elastic supports between and in direct contact with a respective one of the plurality of first touch control blocks and a respective one of the plurality of second touch control blocks. Optionally, when the touch control structure is in a first state without a touch, the respective one of the plurality of first touch control blocks comprises a first overlapping portion and a first margin portion abutting the first overlapping portion, and the respective one of the plurality of second touch control blocks comprises a second overlapping portion and a second margin portion abutting the second overlapping portion. Optionally, an orthographic projection of the first overlapping portion on a base substrate completely overlaps with an orthographic projection of the second overlapping portion on the base substrate, resulting in a first overlapping area. Optionally, the first overlapping portion and the first margin portion are arranged along a direction the same as a direction along which the second margin portion and the second overlapping portion are arranged.

In some embodiments, the method includes detecting a change of capacitance between the respective one of the plurality of first touch control blocks and the respective one of the plurality of second touch control blocks upon a touch; and determining a touch position and a touch pressure based on a change of capacitance.

In some embodiments, orthographic projections of respective portions of the respective one of the plurality of first touch control blocks and the respective one of the plurality of second touch control blocks on a base substrate completely overlap with each other, resulting in an overlapping area. Optionally, the respective one of the plurality of first touch control blocks and the respective one of the plurality of second touch control blocks are spaced apart by a spacing distance. Optionally, the respective one of the plurality of first touch control blocks, the respective one of the plurality of second touch control blocks, and the base substrate are substantially parallel to each other.

In some embodiments, the method includes increasing the overlapping area and decreasing the spacing distance when the touch structure transitions from a first state absent of a touch to a second state in which a touch occurs. Optionally, when the touch control structure is in a second state upon a touch, the respective one of the plurality of first touch control blocks includes a third overlapping portion, and the respective one of the plurality of second touch control blocks includes a fourth overlapping portion. Optionally, an orthographic projection of the third overlapping portion on the base substrate completely overlaps with an orthographic projection of the fourth overlapping portion on the base substrate, resulting in a second overlapping area. Optionally, the first overlapping area is smaller than the second overlapping area. Optionally, when the touch control structure is in the first state without a touch, the respective one of the plurality of first touch control blocks and the respective one of the plurality of second touch control blocks are spaced apart by a first spacing distance; when the touch control structure is in the second state upon a touch, the respective one of the plurality of first touch control blocks and the respective one of the plurality of second touch control blocks are spaced apart by a second spacing distance. Optionally, the second spacing distance is smaller than the first spacing distance.

In some embodiments, the touch control structure includes a first movement guiding protrusion protruding from a surface of the respective one of the plurality of first touch control blocks toward the respective one of the plurality of second touch control blocks; and a second movement guiding protrusion protruding from a surface of the respective one of the plurality of second touch control blocks toward the respective one of the plurality of first touch control blocks.

In some embodiments, the method includes transitioning the touch structure from the first state absent of the touch to the second state in which the touch occurs. Specifically, in some embodiments, the method includes guiding the respective one of the plurality of first touch control blocks relative to the respective one of the plurality of second touch control blocks along a first relative moving direction by the first movement guiding protrusion; and guiding the respective one of the plurality of second touch control blocks relative to the respective one of the plurality of first touch control blocks along a second relative moving direction by the second movement guiding protrusion. Optionally, the first relative moving direction is opposite to a second relative moving direction.

In some embodiments, the first movement guiding protrusion includes a first guiding surface in direct contact with the second movement guiding protrusion in at least one of the first state or the second state, and the second movement guiding protrusion has a second guiding surface in direct contact with the first movement guiding protrusion in at least one of the first state or the second state.

Optionally, when the touch structure transitions from the first state absent of the touch to the second state in which the touch occurs, the method includes moving the second movement guiding protrusion to perform a relative movement, along the first guiding surface, with respect to the first movement guiding protrusion; and moving the first movement guiding protrusion to perform a relative movement, along the second guiding surface, with respect to the second movement guiding protrusion.

Figure 17:
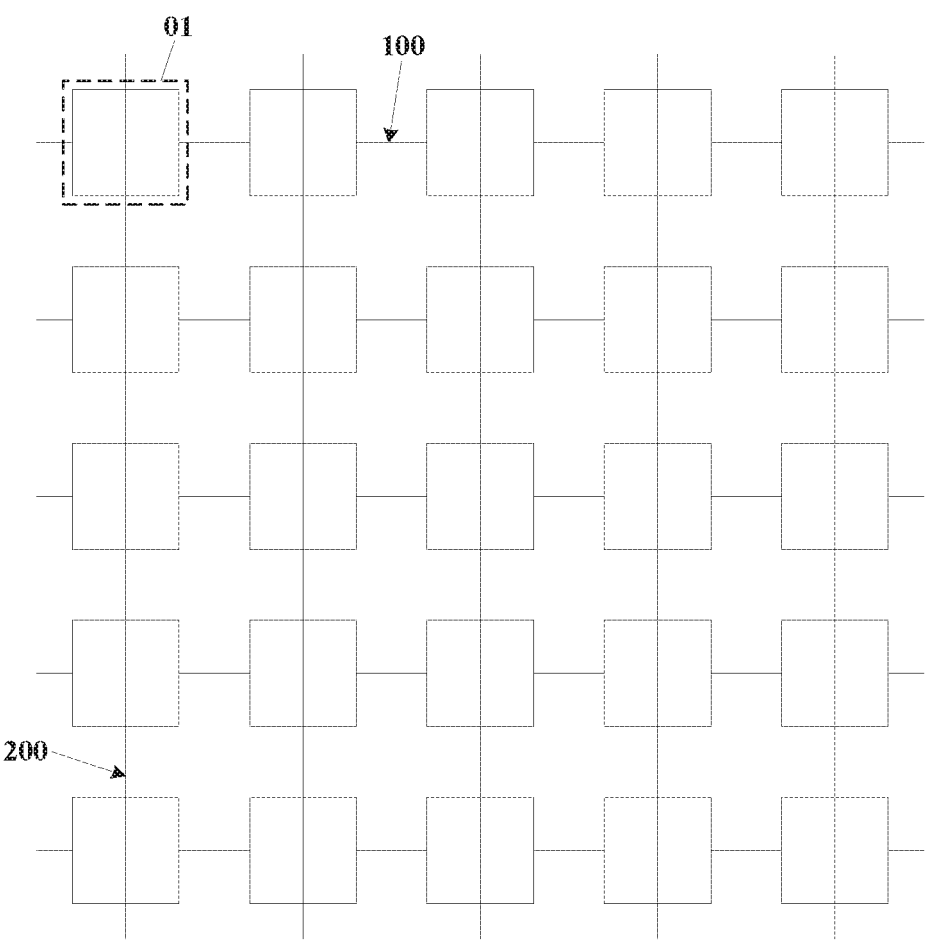
FIG. 17 is a schematic diagram of a touch control apparatus in some embodiments according to the present disclosure.

In another aspect, the present disclosure provides a touch control apparatus. FIG. 17 is a schematic diagram of a touch control apparatus in some embodiments according to the present disclosure. In some embodiments, referring to FIG. 1 and FIG. 17, the touch control apparatus includes a touch control structure described herein, and one or more integrated circuits connected to the touch control structure.

Referring to FIG. 1, optionally, the touch control structure 01 includes a first touch electrode E1 including a plurality of first touch control blocks 10; and a second touch electrode E3 including a plurality of second touch control blocks 20.

Referring to FIG. 17, optionally, the touch control structure 01 includes a respective one of the plurality of first touch control blocks 10; and a respective one of the plurality of second touch control blocks 20.

In some embodiments, referring to FIG. 1 and FIG. 17, the touch control apparatus includes a plurality of first touch control signal lines 100 and a plurality of second touch control signal lines 200.

Optionally, a plurality of rows of first touch control blocks are respectively connected (e.g., electrically connected) by the plurality of first touch control signal lines 100. Optionally, a plurality of columns of second touch control blocks are respectively connected (e.g., electrically connected) by the plurality of second touch control signal lines 200.

When a touch is applied, a capacitance between the respective one of the plurality of first touch control blocks and the respective one of the plurality of second touch control blocks changes. In the process of detecting the capacitance between the respective one of the plurality of first touch control blocks and the respective one of the plurality of second touch control blocks, the plurality of first touch control signal lines sequentially provides scanning signals to the plurality of rows of first touch control blocks, and the plurality of second touch control signal lines detect signals from the plurality of first touch control signal lines, therefore, capacitances between the plurality of first touch control blocks and the plurality of second touch control blocks are detected. For example, when a respective one of the plurality of first touch control signal lines provide a scanning signal to the respective one of the plurality of rows of first touch control blocks, the plurality of second touch control signal lines respectively detect first touch control blocks in the respective one of the plurality of rows of first touch control blocks. Based on changes of capacitances, the touch position and touch pressure can be detected.

In another aspect, the present disclosure also provides a touch control display apparatus. In some embodiments, the touch control display apparatus includes a touch control structure described herein, and one or more integrated circuits connected to the touch control structure.

In some embodiments, the touch control display apparatus includes a liquid crystal display (LCD) substrate. In some embodiments, the touch control display apparatus includes an electroluminescent display substrate. Optionally, the touch control display apparatus includes an organic light emitting diode (OLED) display substrate. For example, the touch control display apparatus further includes the OLED display substrate, and an encapsulating layer encapsulating the OLED display substrate. The touch control structure is on a side of the encapsulating layer away from the OLED display substrate. Optionally, the touch control display apparatus includes a quantum dot organic light emitting diode (QLED) display substrate.

In some embodiments, the touch control display apparatus is a liquid crystal display apparatus including a counter substrate, a touch control structure described herein, the liquid crystal display substrate, and light guide plate configured to provide light to the liquid crystal display substrate.

Figure 18A:
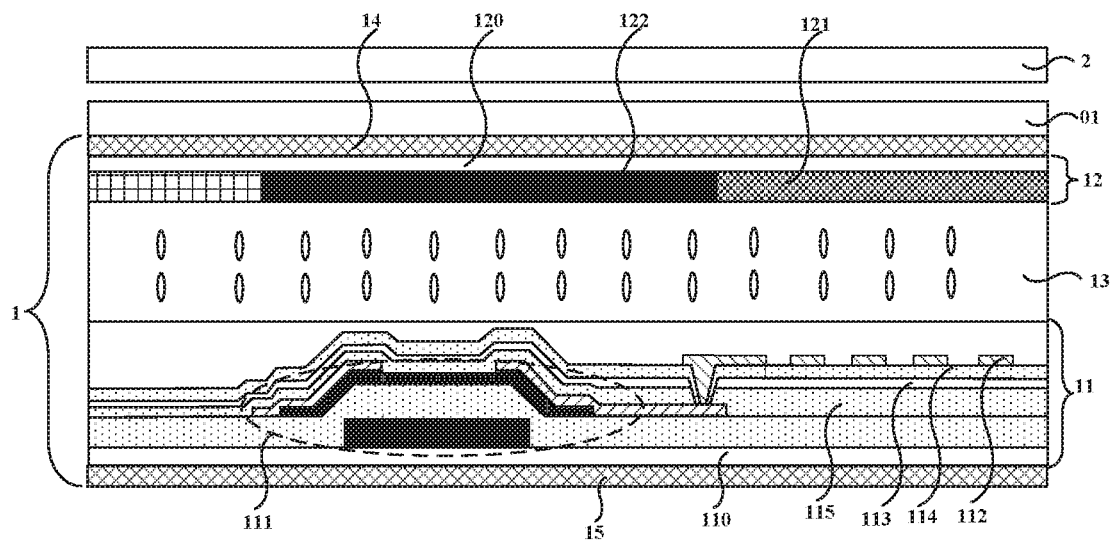
FIG. 18A is a schematic diagram of a touch control display apparatus in some embodiments according to the present disclosure.
Figure 18B:
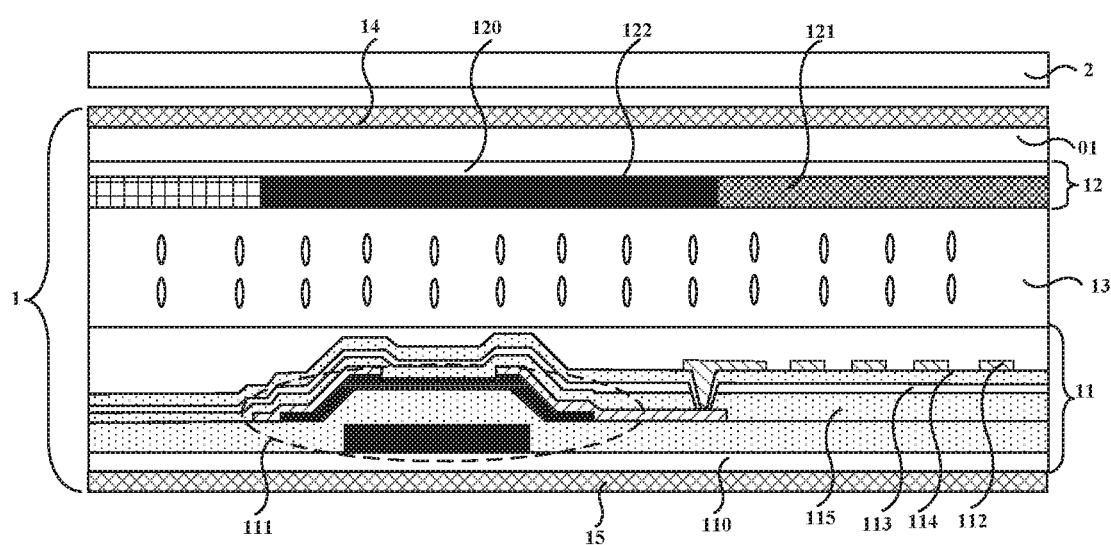
FIG. 18B is a schematic diagram of a touch control display apparatus in some embodiments according to the present disclosure.
Figure 18C:
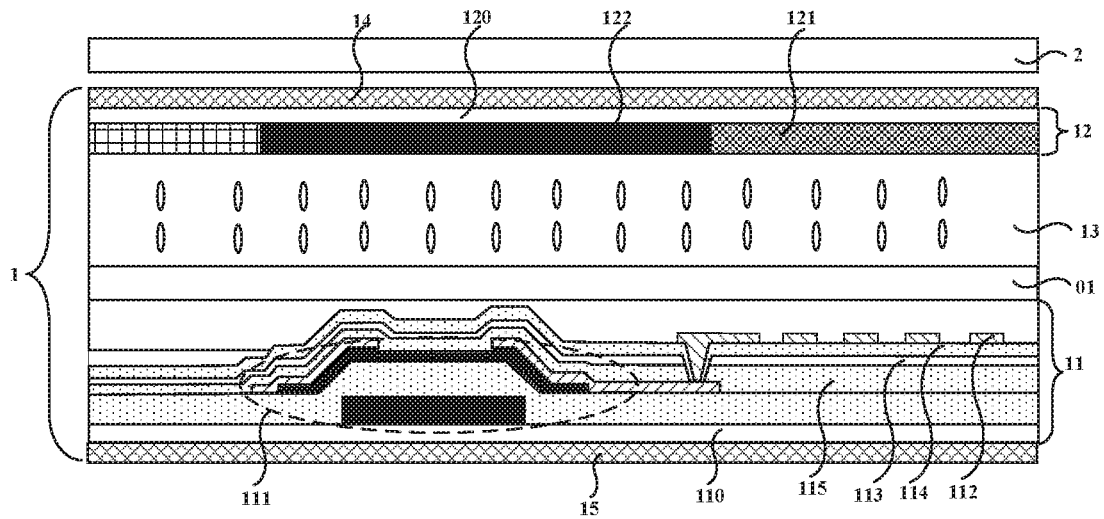
FIG. 18C is a schematic diagram of a touch control display apparatus in some embodiments according to the present disclosure.

FIG. 18A is a schematic diagram of a touch control display apparatus in some embodiments according to the present disclosure. FIG. 18B is a schematic diagram of a touch control display apparatus in some embodiments according to the present disclosure. FIG. 18C is a schematic diagram of a touch control display apparatus in some embodiments according to the present disclosure. Referring to FIG. 18A to FIG. 18C, in some embodiments, the liquid crystal display substrate 1 includes an array substrate 11, a counter substrate 12, and a liquid crystal layer 13 between the array substrate 11 and the counter substrate 12.

Optionally, the liquid crystal display substrate has a plurality of subpixel regions and an inter-subpixel region.

As used herein, the term "subpixel region" refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, the term "inter-subpixel region" refers to a region between adjacent subpixel regions, such as a region corresponding to a black matrix in a liquid crystal display, a region corresponding a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Optionally, the array substrate 11 includes a plurality of thin film transistors 111 and a plurality of pixel electrodes 112 on the first base substrate 110 respectively in the plurality of subpixel regions. Optionally, a respective one of the plurality of thin film transistors 111 includes an active layer, a source electrode, a drain electrode, a gate electrode, and a gate insulating layer. For example, the source electrode and the drain electrode are in direct contact with the active layer, and the drain electrode is electrically connected to a respective one of the plurality of pixel electrodes 112.

Referring to FIG. 18A, the array substrate 11 further includes a common electrode 113 on the first base substrate 110. Optionally, the plurality of pixel electrodes 112 and the common electrode 113 are in different layers. For example, a first insulating layer 114 is between the plurality of pixel electrode 112 and the common electrode 113. A second insulating layer 115 on a side of the common electrode 113 closer to the first base substrate 110.

Optionally, the plurality of pixel electrodes 112 and the common electrode 113 are in a same layer. For example, a respective one of the plurality of pixel electrodes 112 have a strip shape, and common electrodes 113 has a plurality of common sub-electrodes each of which has the strip shape.

Optionally, the common electrode in on a side of the counter substrate 12 closer to the first base substrate 110.

Referring to FIG. 18A to FIG. 18C, in some embodiments, the counter substrate 12 includes a color filter 121 on a side of the second base substrate 120 closer to the first base substrate 110. Optionally, the color filter 121 includes a plurality of photoresist units, a respective one of the plurality of photoresist units is selected from a group consisting of a photoresist unit in red color, a photoresist unit in green color, and a photoresist unit in blue color. Optionally, the plurality of photoresist units are respectively in the plurality of subpixel regions.

In some embodiments, the counter substrate 12 further includes a black matrix 122 on a side of the second base substrate 120 closer to the first base substrate 110. The plurality of photoresists units are spaced apart by the black matrix.

In some embodiments, the liquid crystal display substrate 1 includes a first polarizer 14 on a side of the counter substrate 12 away from the liquid crystal layer 13, and a second polarizer 15 on a side of the array substrate 11 away from the liquid crystal layer 13.

In some embodiments, referring to FIG. 18A, the touch control structure 01 is on the liquid crystal display substrate 1. For example, the touch control structure 01 is between a glass substrate 2 and the first polarizer 14, so that the touch control structure 01 is called an external (e.g., add-on) touch control structure.

In some embodiments, referring to FIG. 18B and FIG. 18C, the liquid crystal display substrate 1 includes the touch control structure 01, so that the touch control structure is called internal touch control structure.

Optionally, referring to FIG. 18B, the touch control structure 01 is between the first polarizer 14 and the counter substrate 12, so that the touch control structure is an on-cell touch control structure.

Optionally, referring to FIG. 18C, the touch control structure 01 is between the first base substrate 110 and the second base substrate 120, for example, the touch control structure 01 is on a side of liquid crystal layer 13 closer to the first base substrate 110, so that, the touch control structure is an in-cell touch control structure.

Figure 19A:
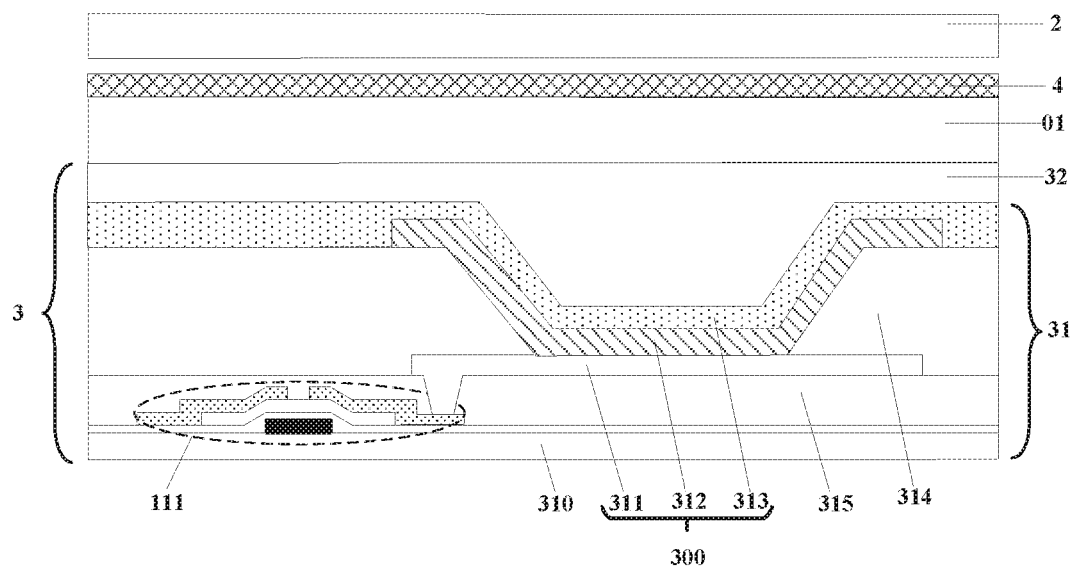
FIG. 19A is a schematic diagram of a touch control display apparatus in some embodiments according to the present disclosure.
Figure 19B:
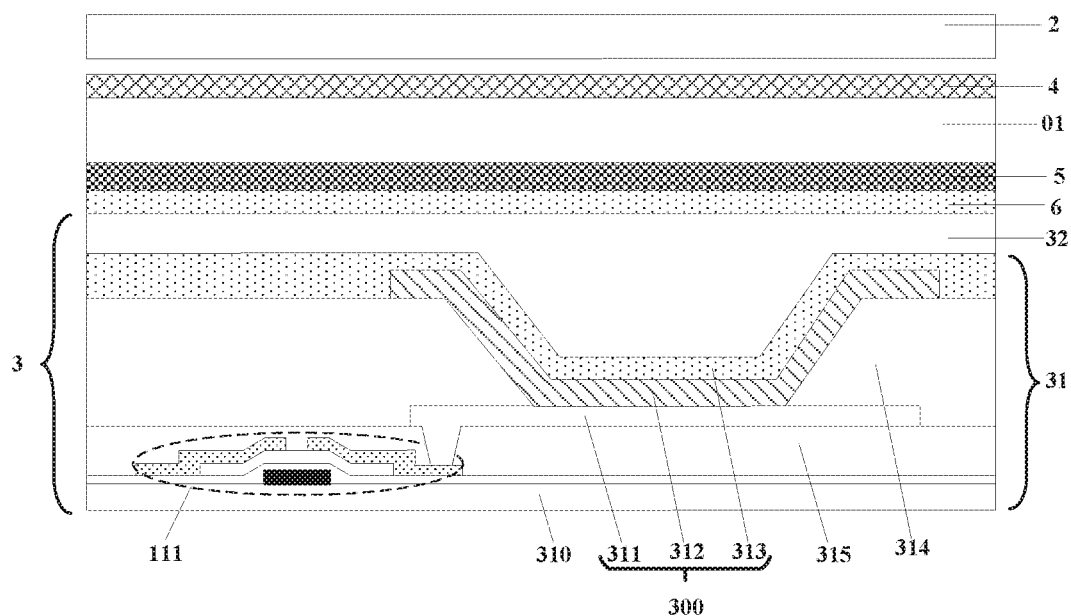
FIG. 19B is a schematic diagram of a touch control display apparatus in some embodiments according to the present disclosure.

FIG. 19A is a schematic diagram of a touch control display apparatus in some embodiments according to the present disclosure. FIG. 19B is a schematic diagram of a touch control display apparatus in some embodiments according to the present disclosure. In some embodiments, referring to FIG. 19A and FIG. 19B, the touch control display apparatus is an electroluminescent display apparatus including the electroluminescent display substrate 3, the touch control structure 01, a polarizer 4, and a glass substrate 2.

Optionally, the electroluminescent display substrate 3 includes an electroluminescent array substrate 31 and an encapsulating layer 32 configured to encapsulating the electroluminescent array substrate 31. Optionally, the encapsulating layer 32 can be a thin film encapsulation (TFE), or an encapsulating substrate.

Optionally, the electroluminescent array substrate 31 includes a plurality of light emitting elements 300 on the third base substrate 310 respectively in the plurality of subpixel regions; and a driving circuit. For example, the driving circuit includes a plurality of thin film transistors 111.

Optionally, a respective one of the plurality of light emitting elements includes an anode 311, a light emitting functional layer 312, and a cathode 313. The anode 311 is electrically connected to a drain electrode of a corresponding driving thin film transistor of the plurality of thin film transistors 111.

Optionally, the electroluminescent array substrate 31 further includes pixel definition layer 314 defining a plurality of pixel apertures. The plurality of light emitting elements 300 are respectively in the plurality of pixel apertures.

Optionally, the light emitting functional layer 312 includes a light emitting sub-layer. Optionally, the light emitting functional layer 312 includes one or a combination of an election transporting sub-layer (ETL), an election injection sub-layer (EIL), a hole transporting sub-layer (HTL), and a hole injection layer (HIL).

Optionally, referring to FIG. 19A, the electroluminescent array substrate 31 further includes a planarization layer 315 between the plurality of thin film transistors 111 and the anode 311.

Optionally, the touch control display apparatus is a top-emitting type electroluminescent display apparatus. For example, the anode 311 is non-transparent, the cathode 313 is substantially transparent. As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

Optionally, the touch control display apparatus is a bottom-emitting type electroluminescent display apparatus. For example, the anode 311 is substantially transparent, the cathode 313 is non-transparent.

Optionally, the touch control display apparatus is a dual-side-emitting type electroluminescent display apparatus. For example, the anode 311 and the cathode 313 are substantially transparent.

Optionally, referring to FIG. 19A, the touch control structure 01 is on a side of the encapsulating layer 32 away from the electroluminescent array substrate 31. Optionally, the touch control structure 01 is in direct contact of the encapsulating layer 32. A thickness of the touch control display apparatus is relatively small by using this arrangement of the touch control structure, and it is easy to fabricate a flexible display apparatus using this arrangement of the touch control structure.

Optionally, referring to FIG. 19B, the touch control structure 01 is on an electroluminescent counter substrate 5. For example, the electroluminescent counter substrate 5 is attached to the encapsulating layer 32 using an optical glue 6. Various appropriate materials may be used for making the electroluminescent counter substrate 5. Examples of materials suitable for making the electroluminescent counter substrate 5 include, but are not limited to, Polyethylene Terephthalate (PET), Polyimide (PI), and Cyclo Olefin Polymer (COP).

Figure 20:
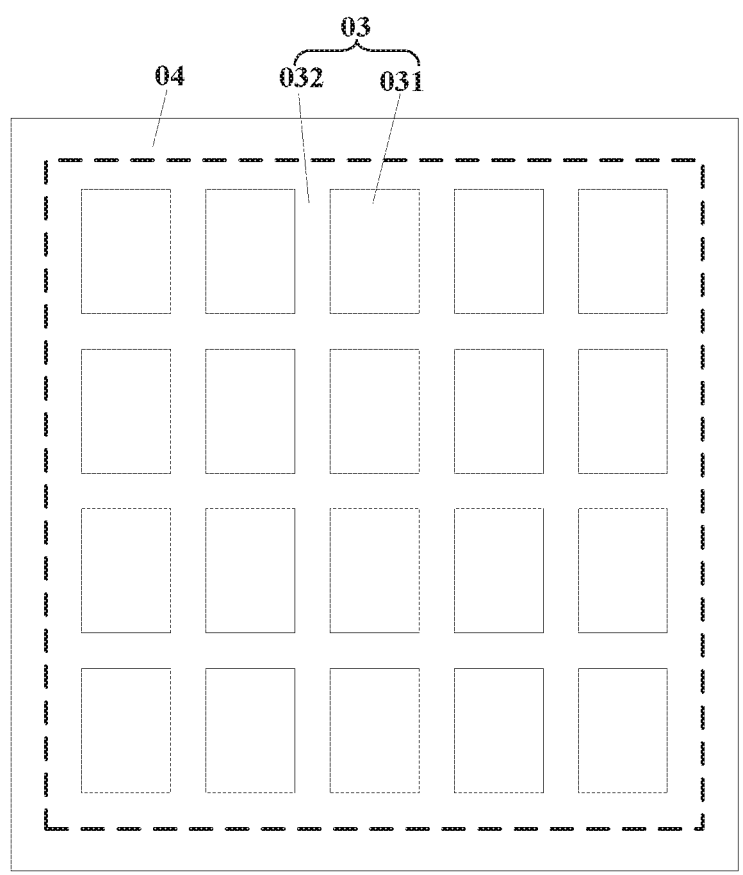
FIG. 20 is a plan view of a touch control display apparatus in some embodiments according to the present disclosure.

FIG. 20 is a plan view of a touch control display apparatus in some embodiments according to the present disclosure. In some embodiments, referring to FIG. 20, the touch control display apparatus includes a display area 03 and a peripheral area 04. Optionally, the display area 03 includes the plurality of subpixel regions 031, and the inter-subpixel region 032.

As used herein, the term "display area" refers to an area of the display substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

Optionally, the touch control structure 01 is disposed in both the plurality of subpixel region 031 and the inter-subpixel region 032. Optionally, the touch control structure is limited in the plurality of subpixel regions 031. Optionally, the touch control structure is limited in the inter-subpixel region 032.

For example, when the touch control structure 01 is disposed in the plurality of subpixel regions 031, portions of the touch control structure in the plurality of subpixel regions 031 are substantially transparent.

For example, when the touch control structure 01 is limited in the inter-subpixel region 032, the touch control structure 01 will not have an adverse effect on the transmittance of the touch control display apparatus.

Examples of appropriate touch control display apparatuses described herein include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch control structure, comprising:
a first touch electrode comprising a plurality of first touch control blocks;
a second touch electrode comprising a plurality of second touch control blocks; and
one or more reversibly deformable elastic supports between and in direct contact with a respective one of the plurality of first touch control blocks and a respective one of the plurality of second touch control blocks;
wherein, when the touch control structure is in a first state without a touch, the respective one of the plurality of first touch control blocks comprises a first overlapping portion and a first margin portion abutting the first overlapping portion, and the respective one of the plurality of second touch control blocks comprises a second overlapping portion and a second margin portion abutting the second overlapping portion;
wherein an orthographic projection of the first overlapping portion on a base substrate completely overlaps with an orthographic projection of the second overlapping portion on the base substrate, resulting in a first overlapping area; and
the first overlapping portion and the first margin portion are arranged along a direction the same as a direction along which the second margin portion and the second overlapping portion are arranged.

2. The touch control structure of claim 1, wherein, when the touch control structure is in a second state upon a touch, the respective one of the plurality of first touch control blocks comprises a third overlapping portion, and the respective one of the plurality of second touch control blocks comprises a fourth overlapping portion;
wherein an orthographic projection of the third overlapping portion on the base substrate completely overlaps with an orthographic projection of the fourth overlapping portion on the base substrate, resulting in a second overlapping area; and
the first overlapping area is smaller than the second overlapping area.

3. The touch control structure of claim 2, wherein the respective one of the plurality of first touch control blocks comprises a first side, and a second side opposite to the first side;
the respective one of the plurality of second touch control blocks comprises a third side, and a fourth side opposite to the third side;
wherein in the first state, an orthographic projection of at least a portion of the first side on the respective one of the plurality of second touch control blocks is between the third side and the fourth side; and
an orthographic projection of at least a portion of the fourth side on the respective one of the plurality of first touch control blocks is between the first side and the second side.

4. The touch control structure of claim 3, wherein a first distance between the orthographic projection of the first side on the respective one of the plurality of second touch control blocks and the third side decreases from the first state to the second state; and a second distance between the second side and the orthographic projection of the fourth side on the respective one of the plurality of second touch control blocks decreases from the first state to the second state.

5. The touch control structure of claim 4, further comprising a first movement guiding protrusion protruding from a surface of the respective one of the plurality of first touch control blocks toward the respective one of the plurality of second touch control blocks; and
a second movement guiding protrusion protruding from a surface of the respective one of the plurality of second touch control blocks toward the respective one of the plurality of first touch control blocks.

6. The touch control structure of claim 5, wherein during at least a sub-period of a period during which the touch control structure transition from the first state to the second state,
the first movement guiding protrusion is configured to guide the respective one of the plurality of first touch control blocks to move relative to the respective one of the plurality of second touch control blocks along a first relative moving direction opposite to a second relative moving direction along which the second movement guiding protrusion is configured to guide the respective one of the plurality of second touch control blocks to move relative to the respective one of the plurality of first touch control blocks.

7. The touch control structure of claim 6, wherein the respective one of the plurality of first touch control blocks and the respective one of the plurality of second touch control blocks are spaced apart by a spacing distance;
wherein during the at least the sub-period,
the spacing distance is positively correlated to the first distance, and positively correlated to the second distance.

8. The touch control structure of claim 7, wherein the first movement guiding protrusion comprises a first guiding surface in direct contact with the second movement guiding protrusion in at least one of the first state or the second state;
wherein during the at least the sub-period,
the second movement guiding protrusion undergoes a relative movement, along the first guiding surface, with respect to the first movement guiding protrusion.

9. The touch control structure of claim 8, wherein the second movement guiding protrusion has a second guiding surface in direct contact with the first movement guiding protrusion in at least one of the first state or the second state;
wherein during the at least the sub-period,
the first movement guiding protrusion undergoes a relative movement, along the second guiding surface, with respect to the second movement guiding protrusion.

10. The touch control structure of claim 9, wherein
planes respectively containing the first guiding surface and the second guiding surface are substantially parallel to each other;
a first included angle between the first guiding surface and a first contacting interface between the first movement guiding protrusion and the respective one of the plurality of first touch control blocks is an acute angle; and
a second included angle between the second guiding surface and a second contacting interface between the second movement guiding protrusion and the respective one of the plurality of second touch control blocks is an acute angle.

11. The touch control structure of claim 10, wherein the first movement guiding protrusion and the second movement guiding protrusion have shapes selected from a group consisting of a triangular prism, and a parallel hexahedron.

12. The touch control structure of claim 7, wherein the first movement guiding protrusion has a first guiding surface in direct contact with the second movement guiding protrusion in at least one of the first state or the second state;

the second movement guiding protrusion has a second guiding surface in direct contact with the first movement guiding protrusion in at least one of the first state or the second state; and the first guiding surface and the second guiding surface are convex surfaces.

13. The touch control structure of claim 12, wherein the first movement guiding protrusion and the second movement guiding protrusion have partial spherical shapes; and along a plane perpendicular to the respective one of the plurality of first touch control blocks and perpendicular to the respective one of the plurality of second touch control blocks, a cross section of the first movement guiding protrusion and a cross section of the second movement guiding protrusion are partial circular shapes.

14. A method of detecting a touch using a touch control structure, wherein the touch control structure comprises a first touch electrode comprising a plurality of first touch control blocks;

a second touch electrode comprising a plurality of second touch control blocks; and one or more elastic supports between and in direct contact with a respective one of the plurality of first touch control blocks and a respective one of the plurality of second touch control blocks;

wherein, when the touch control structure is in a first state without a touch, the respective one of the plurality of first touch control blocks comprises a first overlapping portion and a first margin portion abutting the first overlapping portion, and the respective one of the plurality of second touch control blocks comprises a second overlapping portion and a second margin portion abutting the second overlapping portion;

wherein an orthographic projection of the first overlapping portion on a base substrate completely overlaps with an orthographic projection of the second overlapping portion on the base substrate, resulting in a first overlapping area; and the first overlapping portion and the first margin portion are arranged along a direction the same as a direction along which the second margin portion and the second overlapping portion are arranged;

the method comprises:

detecting a change of capacitance between the respective one of the plurality of first touch control blocks and the respective one of the plurality of second touch control blocks upon a touch; and determining a touch position and a touch pressure based on a change of capacitance.

15. The method of claim 14, wherein orthographic projections of respective portions of the respective one of the plurality of first touch control blocks and the respective one of the plurality of second touch control blocks on a base substrate completely overlap with each other, resulting in an overlapping area; and the respective one of the plurality of first touch control blocks and the respective one of the plurality of second touch control blocks are spaced apart by a spacing distance;

the method comprises increasing the overlapping area and decreasing the spacing distance when the touch structure transitions from a first state absent of a touch to a second state in which a touch occurs.

16. A touch control apparatus, comprising:
a touch control structure of claim 1; and
one or more integrated circuits connected to the touch control structure.

17. A touch control display apparatus, comprising:
a touch control structure of claim 1; and
one or more integrated circuits connected to the touch control structure.

18. The touch control display apparatus of claim 17, further comprising:
a display area comprising a plurality of subpixel regions and an inter-subpixel region;
wherein the touch control structure is limited in the inter-subpixel region.

19. The touch control display apparatus of claim 17, further comprising a liquid crystal display substrate.

20. The touch control display apparatus of claim 17, further comprising an organic light emitting diode (OLED) display substrate; and
an encapsulating layer encapsulating the OLED display substrate;
wherein the touch control structure is on a side of the encapsulating layer away from the OLED display substrate.

* * * * *